US011804169B2

(12) United States Patent
Xuan et al.

(10) Patent No.: US 11,804,169 B2
(45) Date of Patent: *Oct. 31, 2023

(54) PIXEL DRIVING CIRCUIT HAVING TIME CONTROL SUB-CIRCUIT AND DRIVING METHOD THEREFOR, AND DISPLAY PANEL

(71) Applicant: BOE TECHNOLOGY GROUP CO., LTD., Beijing (CN)

(72) Inventors: Minghua Xuan, Beijing (CN); Dongni Liu, Beijing (CN); Qi Qi, Beijing (CN); Jing Liu, Beijing (CN); Han Yue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 14 days.

This patent is subject to a terminal disclaimer.

(21) Appl. No.: 17/426,594

(22) PCT Filed: Dec. 17, 2020

(86) PCT No.: PCT/CN2020/137141
§ 371 (c)(1),
(2) Date: Jul. 28, 2021

(87) PCT Pub. No.: WO2021/135971
PCT Pub. Date: Jul. 8, 2021

(65) Prior Publication Data
US 2022/0059021 A1 Feb. 24, 2022

(30) Foreign Application Priority Data
Jan. 3, 2020 (CN) .......................... 202010003826.9

(51) Int. Cl.
*G09G 3/32* (2016.01)
*G09G 3/3233* (2016.01)
(Continued)

(52) U.S. Cl.
CPC ............ *G09G 3/32* (2013.01); *G09G 3/3208* (2013.01); *G09G 3/3233* (2013.01);
(Continued)

(58) Field of Classification Search
CPC ...... G09G 3/32; G09G 3/3208; G09G 3/3233; G09G 3/3266; G09G 2300/0426;
(Continued)

(56) References Cited

U.S. PATENT DOCUMENTS

| 11,257,423 | B2 * | 2/2022 | Liu | .......................... G09G 3/32 |
| 2021/0407380 | A1 * | 12/2021 | Liu | ...................... G09G 3/3208 |
| 2022/0319401 | A1 * | 10/2022 | Yue | .......................... G09G 3/32 |

* cited by examiner

*Primary Examiner* — Adam J Snyder
(74) *Attorney, Agent, or Firm* — IP & T GROUP LLP

(57) ABSTRACT

A pixel driving circuit includes a driving control sub-circuit and a time control sub-circuit. The driving control sub-circuit includes a first driving sub-circuit. The first driving sub-circuit is configured to output a driving signal to drive an element to be driven to operate. The time control sub-circuit includes a second driving sub-circuit. The second driving sub-circuit is configured to output a third voltage signal to make the first driving sub-circuit stop outputting the driving signal, so as to control operating duration of the element to be driven.

16 Claims, 13 Drawing Sheets

(51) Int. Cl.
G11C 19/28 (2006.01)
G09G 3/3266 (2016.01)
G09G 3/3208 (2016.01)

(52) U.S. Cl.
CPC ... *G09G 3/3266* (2013.01); *G09G 2300/0426* (2013.01); *G09G 2300/0809* (2013.01); *G09G 2300/0819* (2013.01); *G09G 2300/0842* (2013.01); *G09G 2300/0861* (2013.01); *G09G 2310/0286* (2013.01); *G09G 2310/061* (2013.01); *G09G 2310/08* (2013.01); *G09G 2320/0233* (2013.01); *G09G 2330/021* (2013.01); *G11C 19/28* (2013.01)

(58) Field of Classification Search
CPC ... G09G 2300/0809; G09G 2300/0819; G09G 2300/0842; G09G 2300/0861; G09G 2310/0286; G09G 2310/061; G09G 2310/08; G09G 2320/0233; G09G 2330/021; G11C 19/288
See application file for complete search history.

PIXEL DRIVING CIRCUIT HAVING TIME CONTROL SUB-CIRCUIT AND DRIVING METHOD THEREFOR, AND DISPLAY PANEL

CROSS-REFERENCE TO RELATED APPLICATIONS

This application is a national phase entry under 35 USC 371 of International Patent Application No. PCT/CN2020/137141 filed on Dec. 17, 2020, which claims priority to Chinese Patent Application No. 202010003826.9, filed on Jan. 3, 2020, which are incorporated herein by reference in their entirety.

TECHNICAL FIELD

The present disclosure relates to the field of display technologies, and in particular, to a pixel driving circuit and a driving method therefor, and a display panel.

BACKGROUND

A pixel driving circuit composed of micro light-emitting devices has a relatively small size and is suitable for a glass-based driving backplane. However, due to the uniformity of the manufacturing process, the turn-on voltage of the micro light-emitting devices are not consistent. The photoelectric conversion characteristics of the micro light-emitting device (including the photoelectric conversion efficiency, uniformity, chromaticity coordinates, etc.) will change with the change of the current flowing through the micro light-emitting device. For example, at a low current density, the luminous efficiency of the micro light-emitting device will decrease as the current density decreases, which results in a high luminous power consumption. In a case where the micro light-emitting device is applied to the display panel, it will have a certain effect on the display effect of the display panel.

SUMMARY

In one aspect, a pixel driving circuit is provided, which includes a driving control sub-circuit and a time control sub-circuit. The driving control sub-circuit is at least connected to a first scanning signal terminal, a first data signal terminal, a first power supply voltage signal terminal, an enable signal terminal, and a first electrode of an element to be driven. The driving control sub-circuit includes a first driving sub-circuit. The driving control sub-circuit is configured to: write at least a first data signal from the first data signal terminal into the first driving sub-circuit in response to a first scanning signal received from the first scanning signal terminal, and make the first driving sub-circuit output a driving signal according to the first data signal and a first power supply voltage signal from the first power supply voltage signal terminal in response to an enable signal received from the enable signal terminal, so as to drive the element to be driven to operate.

The time control sub-circuit is at least connected to a first voltage signal terminal, a second voltage signal terminal, a third voltage signal terminal, a second scanning signal terminal, a second data signal terminal, the enable signal terminal, and the first driving sub-circuit. The time control sub-circuit includes a second driving sub-circuit. The time control sub-circuit is configured to: write a second data signal from the second data signal terminal and a second voltage signal from the second voltage signal terminal into the second driving sub-circuit in response to a second scanning signal received from the second scanning signal terminal; and write a first voltage signal varying within a set voltage range from the first voltage signal terminal into the second driving sub-circuit, and make the second driving sub-circuit be electrically connected with the third voltage signal terminal and the first driving sub-circuit, in response to the enable signal received from the enable signal terminal. The second driving sub-circuit is configured to output a third voltage signal from the third voltage signal terminal to the first driving sub-circuit at least in response to the second data signal and a change in voltage of the first voltage signal, so as to make the first driving sub-circuit stop outputting the driving signal, and control operating duration of the element to be driven.

In some embodiments, the driving control sub-circuit further includes a first data writing sub-circuit, a first threshold voltage compensation sub-circuit, and a first control sub-circuit. The first driving sub-circuit includes a driving transistor and a first capacitor. A first electrode of the first capacitor is connected to the first power supply voltage signal terminal, a second electrode of the first capacitor is connected to a first node, and a gate of the driving transistor is connected to the first node. The first data writing sub-circuit is connected to the first scanning signal terminal, the first data signal terminal, and a first electrode of the driving transistor. The first data writing sub-circuit is configured to write the first data signal from the first data signal terminal into the first electrode of the driving transistor in response to the first scanning signal received from the first scanning signal terminal. The first threshold voltage compensation sub-circuit is connected to the first scanning signal terminal, a second electrode of the driving transistor, and the first node. The first threshold voltage compensation sub-circuit is configured to transmit the first data signal and a threshold voltage of the driving transistor to the first node in response to the first scanning signal received from the first scanning signal terminal, so as to perform a threshold voltage compensation on the driving transistor. The first control sub-circuit is connected to the enable signal terminal, the first power supply voltage signal terminal, the driving transistor, and the first electrode of the element to be driven. The first control sub-circuit is configured to make the first power supply voltage signal terminal be electrically connected with the first electrode of the driving transistor, and make the second electrode of the driving transistor be electrically connected with the first electrode of the element to be driven, in response to the enable signal received from the enable signal terminal.

In some embodiments, the first data writing sub-circuit includes a second transistor. A gate of the second transistor is connected to the first scanning signal terminal, a first electrode of the second transistor is connected to the first data signal terminal, and a second electrode of the second transistor is connected to the first electrode of the driving transistor.

In some embodiments, the first threshold voltage compensation sub-circuit includes a third transistor. A gate of the third transistor is connected to the first scanning signal terminal, a first electrode of the third transistor is connected to the second electrode of the driving transistor, and a second electrode of the third transistor is connected to the first node.

In some embodiments, the first control sub-circuit includes a fourth transistor and a fifth transistor. A gate of the fourth transistor is connected to the enable signal terminal, a first electrode of the fourth transistor is connected to the first power supply voltage signal terminal, and a second electrode of the fourth transistor is connected to the first electrode of the driving transistor. A gate of the fifth transistor is connected to the enable signal terminal, a first electrode of the fifth transistor is connected to the second electrode of the driving transistor, and a second electrode of the fifth transistor is connected to the first electrode of the element to be driven.

In some embodiments, the driving control sub-circuit further includes a reset sub-circuit. The reset sub-circuit is connected to an initial signal terminal, a reset signal terminal and the first driving sub-circuit. The reset sub-circuit is configured to transmit an initial signal from the initial signal terminal to the first driving sub-circuit in response to a reset signal received from the reset signal terminal, so as to reset the first driving sub-circuit.

In some embodiments, the reset sub-circuit includes a sixth transistor. A gate of the sixth transistor is connected to the reset signal terminal, a first electrode of the sixth transistor is connected to the initial signal terminal, and a second electrode of the sixth transistor is connected to the first driving sub-circuit.

In some embodiments, the time control sub-circuit further includes a second data writing sub-circuit, a second threshold voltage compensation sub-circuit, and a second control sub-circuit. The second driving sub-circuit includes a first transistor and a second capacitor. A first electrode of the second capacitor is connected to a second node, a second electrode of the second capacitor is connected to a third node, and a gate of the first transistor is connected to the third node. The second data writing sub-circuit is connected to the second scanning signal terminal, the second voltage signal terminal, the second data signal terminal, the second node, and a first electrode of the first transistor. The second data writing sub-circuit is configured to write the second data signal from the second data signal terminal into the second node, and write the second voltage signal from the second voltage signal terminal into the first electrode of the first transistor, in response to the second scanning signal received from the second scanning signal terminal. The second threshold voltage compensation sub-circuit is connected to the second scanning signal terminal, a second electrode of the first transistor, and the third node. The second threshold voltage compensation sub-circuit is configured to transmit the second voltage signal and a threshold voltage of the first transistor to the third node in response to the second scanning signal received from the second scanning signal terminal. The second control sub-circuit is connected to the enable signal terminal, the first voltage signal terminal, the third voltage signal terminal, the first driving sub-circuit, the second node, and the first transistor. The second control sub-circuit is configured to transmit the first voltage signal from the first voltage signal terminal to the second node, and make the first transistor be electrically connected with the third voltage signal terminal and the first driving sub-circuit, in response to the enable signal received from the enable signal terminal.

In some embodiments, the second data writing sub-circuit includes a seventh transistor and an eighth transistor. A gate of the seventh transistor is connected to the second scanning signal terminal, a first electrode of the seventh transistor is connected to the second data signal terminal, and a second electrode of the seventh transistor is connected to the second node. A gate of the eighth transistor is connected to the second scanning signal terminal, a first electrode of the eighth transistor is connected to the second voltage signal terminal, and a second electrode of the eighth transistor is connected to the first electrode of the first transistor.

In some embodiments, the second threshold voltage compensation sub-circuit includes a ninth transistor. A gate of the ninth transistor is connected to the second scanning signal terminal, a first electrode of the ninth transistor is connected to the second electrode of the first transistor, and a second electrode of the ninth transistor is connected to the third node.

In some embodiments, the second control sub-circuit includes a tenth transistor, an eleventh transistor, and a twelfth transistor. A gate of the tenth transistor is connected to the enable signal terminal, a first electrode of the tenth transistor is connected to the first voltage signal terminal, and a second electrode of the tenth transistor is connected to the second node. A gate of the eleventh transistor is connected to the enable signal terminal, a first electrode of the eleventh transistor is connected to the third voltage signal terminal, and a second electrode of the eleventh transistor is connected to the first electrode of the first transistor. A gate of the twelfth transistor is connected to the enable signal terminal, a first electrode of the twelfth transistor is connected to the second electrode of the first transistor, and a second electrode of the twelfth transistor is connected to the first driving sub-circuit.

In a second aspect, a display panel is provided, which includes a base, a plurality of pixel driving circuits each according to any one of the embodiments disposed on the base, and a plurality of elements to be driven disposed on the base. An element to be driven of the plurality of elements to be driven is connected to a corresponding pixel driving circuit.

In some embodiments, the display panel has a plurality of sub-pixel regions, and each pixel driving circuit is disposed in one sub-pixel region. The display panel further includes a plurality of first scanning signal lines, a plurality of first data signal lines, a plurality of second scanning signal lines and a plurality of second data signal lines. First scanning signal terminals connected to pixel driving circuits located in a same row of sub-pixel regions are connected to a corresponding first scanning signal line. First data signal terminals connected to pixel driving circuits located in a same column of sub-pixel regions are connected to a corresponding first data signal line. Second scanning signal terminals connected to pixel driving circuits located in a same row of sub-pixel regions are connected to a corresponding second scanning signal line. Second data signal terminals connected to pixel driving circuits located in a same column of sub-pixel regions are connected to a corresponding second data signal line.

In some embodiments, the element to be driven is a current mode light-emitting diode.

In some embodiments, the current mode light-emitting diode is a mini light-emitting diode (Mini-LED) or a micro light-emitting diode (Micro-LED).

In some embodiments, the base is a glass substrate.

In a third aspect, a driving method for the pixel driving circuit is provided, including: writing, by the driving control sub-circuit, at least the first data signal from the first data signal terminal into the first driving sub-circuit, in response to the first scanning signal received from the first scanning signal terminal; writing, by the time control sub-circuit, at least the second data signal from the second data signal terminal and the second voltage signal from the second voltage signal terminal into the second driving sub-circuit, in response to the second scanning signal received from the second scanning signal terminal; making, by the driving control sub-circuit, the first driving sub-circuit output the driving signal according to the first data signal and the first power supply voltage signal from the first power supply voltage signal terminal, in response to the enable signal received from the enable signal terminal, so as to drive the element to be driven to operate; and writing, by the time control sub-circuit, the first voltage signal varying within the set voltage range from the first voltage signal terminal into the second driving sub-circuit, and making, by the time control sub-circuit, the second driving sub-circuit electrically be connected with the third voltage signal terminal and the first driving sub-circuit, in response to the enable signal received from the enable signal terminal; wherein the second driving sub-circuit outputs the third voltage signal from the third voltage signal terminal to the first driving sub-circuit to make the first driving sub-circuit stop outputting the driving signal, at least in response to the second data signal and the change in voltage of the first voltage signal, so as to control the operating duration of the element to be driven.

In some embodiments, the driving control sub-circuit further includes a first data writing sub-circuit, a first threshold voltage compensation sub-circuit, and a first control sub-circuit. The first driving sub-circuit includes a driving transistor and a first capacitor. A first electrode of the first capacitor is connected to the first power supply voltage signal terminal, a second electrode of the first capacitor is connected to a first node, and a gate of the driving transistor is connected to the first node. Writing, by the driving control sub-circuit, at least the first data signal from the first data signal terminal into the first driving sub-circuit, in response to the first scanning signal received from the first scanning signal terminal, includes: writing, by the first data writing sub-circuit, the first data signal into a first electrode of the driving transistor, in response to the received first scanning signal; and transmitting, by the first threshold voltage compensation sub-circuit, the first data signal and a threshold voltage of the driving transistor to the first node, in response to the received first scanning signal, so as to perform a threshold voltage compensation on the driving transistor. Making, by the driving control sub-circuit, the first driving sub-circuit output the driving signal according to the first data signal and the first power supply voltage signal from the first power supply voltage signal terminal, in response to the enable signal received from the enable signal terminal, includes: making, by the first control sub-circuit, the driving transistor electrically be connected with the first power supply voltage signal terminal and the element to be driven, in response to the received enable signal.

In some embodiments, the time control sub-circuit further includes a second data writing sub-circuit, a second threshold voltage compensation sub-circuit, and a second control sub-circuit. The second driving sub-circuit includes a first transistor and the second capacitor; a first electrode of the second capacitor is connected to a second node, a second electrode of the second capacitor is connected to a third node, and a gate of the first transistor is connected to the third node. Writing, by the time control sub-circuit, at least the second data signal from the second data signal terminal and the second voltage signal from the second voltage signal terminal into the second driving sub-circuit, in response to the second scanning signal received from the second scanning signal terminal, includes: writing, by the second data writing sub-circuit, the second data signal into the second node, and writing, by the second data writing sub-circuit, the second voltage signal into a first electrode of the first transistor, in response to the received second scanning signal; and transmitting, by the second threshold voltage compensation sub-circuit, the second voltage signal and a threshold voltage of the first transistor to the third node, in response to the received second scanning signal. Writing, by the time control sub-circuit, the first voltage signal varying within the set voltage range from the first voltage signal terminal into the second driving sub-circuit, and making, by the time control sub-circuit, the second driving sub-circuit be electrically connected with the third voltage signal terminal and the first driving sub-circuit, in response to the enable signal received from the enable signal terminal; wherein the second driving sub-circuit outputs the third voltage signal from the third voltage signal terminal to the first driving sub-circuit to make the first driving sub-circuit stop outputting the driving signal, at least in response to the second data signal and the change in voltage of the first voltage signal, includes: transmitting, by the second control sub-circuit, the first voltage signal to the second node, and making, by the second control sub-circuit, the first transistor be electrically connected with the third voltage signal terminal and the first node, in response to the received enable signal.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a to product, an actual process of a method and an actual timing of a signal to which the embodiments of the present disclosure relate.

DETAILED DESCRIPTION

Figure 1:
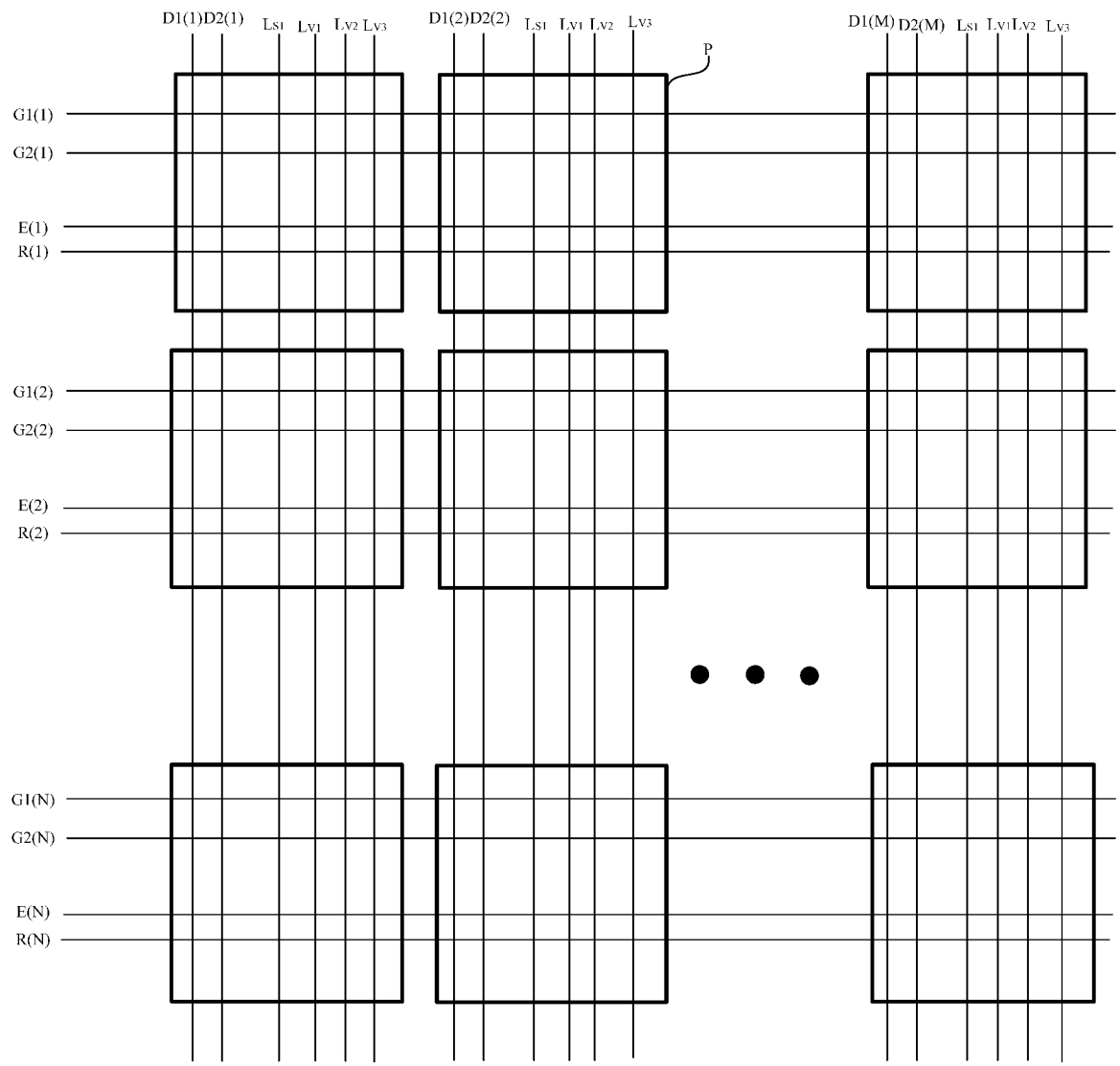
FIG. 1 is a schematic diagram showing a structure of a display panel, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are only used for descriptive purposes, and are not to be construed as indicating or implying the relative importance or implicitly indicating the number of indicated technical features. Thus, features defined as "first" and "second" may explicitly or implicitly include one or more of the features. In the description of the embodiments of the present disclosure, the term "a plurality of" or "the plurality of" means two or more unless otherwise specified.

In the description of some embodiments, the term "connected" and its extensions may be used. For example, the term "connected" may be used in the description of some embodiments to indicate that two or more components are in direct physical contact or electrical contact with each other. However, terms such as "connected" may also mean that two or more components are not in direct contact with each other, but still cooperate or interact with each other. The embodiments disclosed herein are not necessarily limited to the contents herein.

The use of the phrase "applicable to" or "configured to" herein means an open and inclusive language, which does not exclude devices that are applicable to or configured to perform additional tasks or steps.

In the circuit provided by the embodiments of the present disclosure, a first node, a second node, and a third node do not represent actual components, but represent junctions of related electrical connections in a circuit diagram. That is, these nodes are nodes equivalent to the junctions of the related electrical connections in the circuit diagram.

In addition, the use of the phrase "based on" is meant to be open and inclusive, since a process, step, calculation or other action that is "based on" one or more of the stated conditions or values may, in practice, be based on additional conditions or exceeding the stated values.

In some embodiments of the present disclosure, a display apparatus is provided, which includes a display panel. As shown in FIG. 1, the display panel has a plurality of sub-pixel regions P.

It will be noted that, FIG. 1 illustrates an example in which the plurality of sub-pixel regions P are arranged in an array of N rows and M columns, but the embodiments of the present disclosure are not limited thereto, and the plurality of sub-pixel regions P may also be arranged in other manners.

In some embodiments, the display apparatus may be a product with a display function such as a television, a cellphone, a tablet computer, a notebook computer, a display, a digital photo frame or a navigator, which is not limited in the embodiments of the present disclosure.

In some embodiments, the display panel includes a base, a plurality of pixel driving circuits disposed on the base, and a plurality of elements to be driven disposed on the base. An element to be driven of the plurality of elements to be driven is connected to a corresponding pixel driving circuit.

Figure 2:
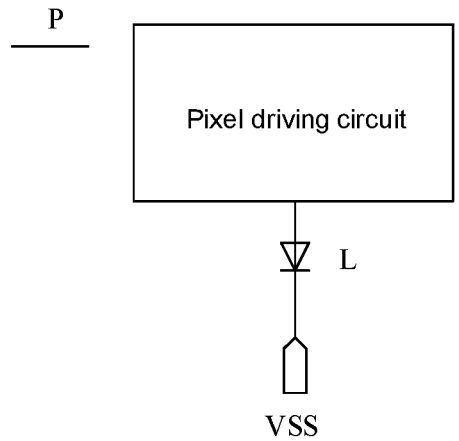
FIG. 2 is a schematic diagram showing a structure of a sub-pixel region, in accordance with some embodiments.

In some examples, as shown in FIG. 2, in a sub-pixel region P of the display panel, the element L to be driven and a pixel driving circuit connected to a first electrode of the element L to be driven are correspondingly provided. The pixel driving circuit is configured to drive the element L to be driven to operate.

A second electrode of the element L to be driven is connected to a second power supply voltage signal terminal VSS.

In some embodiments, the element L to be driven is a current-driven device.

In some examples, the element L to be driven is a current mode light-emitting diode.

For example, the current mode light-emitting diode is a micro light-emitting diode (Micro-LED), a mini light-emitting diode (Mini-LED), or an organic light-emitting diode (OLED).

On this basis, the operation of the element L to be driven operating may be understood as the current mode light-emitting diode emitting light.

In some examples, the first electrode and the second electrode of the element L to be driven are an anode and a cathode of the current mode light-emitting diode, respectively.

In some embodiments, the base is a glass substrate.

Figure 3:
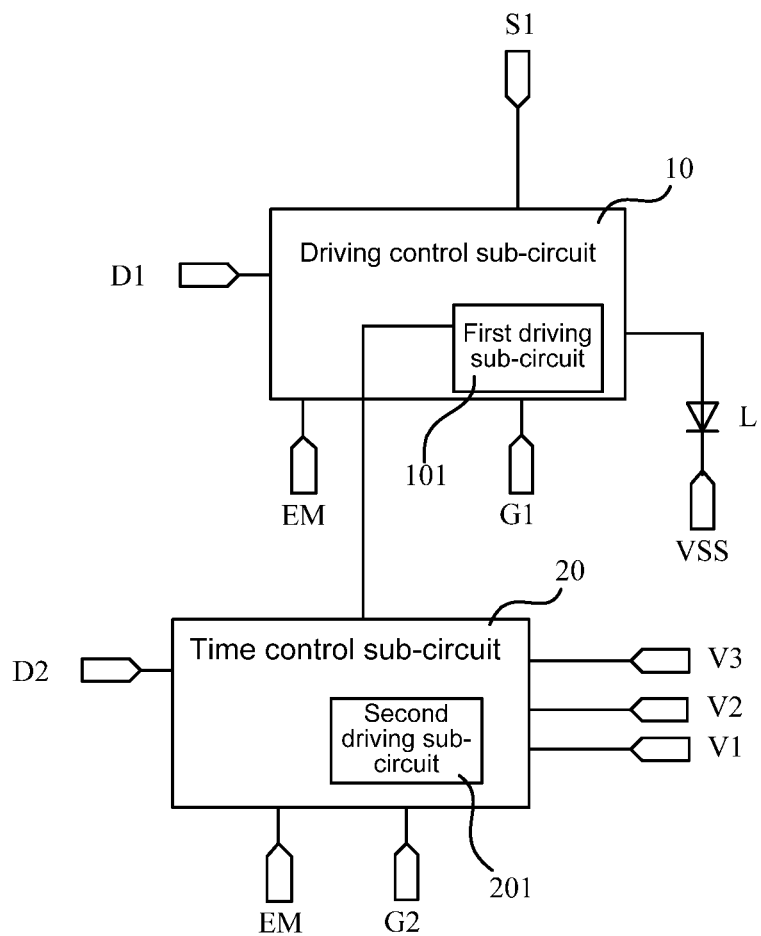
FIG. 3 is a structure block diagram of a pixel driving circuit, in accordance with some embodiments.

As shown in FIG. 3, a pixel driving circuit provided in some embodiments of the present disclosure includes a driving control sub-circuit 10 and a time control sub-circuit 20.

The driving control sub-circuit 10 is at least connected to a first scanning signal terminal G1, a first data signal terminal D1, a first power supply voltage signal terminal S1, an enable signal terminal EM, and the first electrode of the element L to be driven. The driving control sub-circuit 10 includes a first driving sub-circuit 101.

The driving control sub-circuit 10 is configured to write at least a first data signal from the first data signal terminal D1 into the first driving sub-circuit 101 in response to a first scanning signal received from the first scanning signal terminal G1, and make the first driving sub-circuit 101 output a driving signal according to the first data signal and a first power supply voltage signal from the first power supply voltage signal terminal S1 in response to an enable signal received from the enable signal terminal EM, so as to drive the element L to be driven to operate.

The time control sub-circuit 20 is at least connected to a first voltage signal terminal V1, a second voltage signal terminal V2, a third voltage signal terminal V3, a second scanning signal terminal G2, a second data signal terminal D2, the enable signal terminal EM, and the first driving sub-circuit 101. The time control sub-circuit 20 includes a second driving sub-circuit 201.

The time control sub-circuit 20 is configured to write: a second data signal from the second data signal terminal D2 and a second voltage signal from the second voltage signal terminal V2 into the second driving sub-circuit 201 in response to a second scanning signal received from the second scanning signal terminal G2; and write a first voltage signal varying within a set voltage range from the first voltage signal terminal V1 into the second driving sub-circuit 201, and make the second driving sub-circuit 201 be electrically connected with the third voltage signal terminal V3 and the first driving sub-circuit 101, in response to the enable signal received from the enable signal terminal EM. The second driving sub-circuit 201 is configured to output a third voltage signal from the third voltage signal terminal V3 to the first driving sub-circuit 101 at least in response to the second data signal received from the second data signal terminal D2 and a change in voltage of the first voltage signal received from the first voltage signal terminal V1, so as to make the first driving sub-circuit 101 stop outputting driving signals, thereby controlling operating duration of the element L to be driven.

In some embodiments, the driving control sub-circuit 10 outputting the driving signal to drive the element L to be driven to operate may be understood as: the driving control sub-circuit 10 outputting a driving current to the current mode light-emitting diode to drive the current mode light-emitting diode to emit light. The operating duration of the element L to be driven may be understood as luminous duration of the current mode light-emitting diode.

In some examples, the first data signal from the first data signal terminal D1 is a constant high voltage signal, so that the element L to be driven may have a high luminous efficiency. In this case, the pixel driving circuit controls the gray scale through the time control sub-circuit 20.

In some other examples, a voltage of the first data signal from the first data signal terminal D1 changes within a certain voltage range, and the first data signal within the voltage range may ensure that the element L to be driven has a high luminous efficiency. In this case, the pixel driving circuit controls the gray scale through the driving control sub-circuit 10 and the time control sub-circuit 20 together.

In some examples, the second voltage signal from the second voltage signal terminal V2 and the third voltage signal from the third voltage signal terminal V3 are both constant level signals within one frame. Those skilled in the art may set magnitudes of the voltages of both the second voltage signal and the third voltage signal in a case of ensuring the normal operation of the pixel driving circuit.

In some examples, the second voltage signal terminal V2 and the third voltage signal terminal V3 are a same voltage signal terminal. On this basis, the second driving sub-circuit 201 outputs the third voltage signal from the third voltage signal terminal to the first driving sub-circuit 101 in response to the second data signal and the change in voltage of the first voltage signal, so as to make the first driving sub-circuit 101 stop outputting the driving signal, thereby controlling the operating duration of the element L to be driven.

In some other examples, the second voltage signal terminal V2 and the third voltage signal terminal V3 are different voltage signal terminals. On this basis, the second driving sub-circuit 201 outputs the third voltage signal from the third voltage signal terminal to the first driving sub-circuit 101 in response to the second voltage signal from the second voltage signal terminal V2, the third voltage signal from the third voltage signal terminal V3, the second data signal, and the change in voltage of the first voltage signal, so as to make the first driving sub-circuit 101 stop outputting the driving signal, thereby controlling the operating duration of the element L to be driven.

In the driving control sub-circuit 10, a magnitude of the driving signal (e.g., an amplitude of the driving current) transmitted from the driving control sub-circuit 10 to the element L to be driven is controlled by controlling a magnitude of the first data signal provided by the first data signal terminal D1. In the time control sub-circuit 20, time when the third voltage signal provided by the third voltage signal terminal V3 is transmitted to the first driving sub-circuit 101 is controlled by controlling magnitudes of voltages of the second data signal provided by the second data signal terminal D2, the second voltage signal provided by the second voltage signal terminal V2, the third voltage signal provided by the third voltage signal terminal V3, and the first voltage signal provided by the first voltage signal terminal V1, so as to control duration in which the driving signal is transmitted to the element L to be driven. Here, when the third voltage signal is transmitted to the first driving sub-circuit 101, the first driving sub-circuit 101 stops outputting the driving signal, so that the driving control sub-circuit 10 is unable to provide the driving signal to the element L to be driven. As a result, the element L to be driven will not be driven to operate, and the control of the operating duration of the element L to be driven may be achieved.

In the pixel driving circuits in some embodiments of the present disclosure, the driving control sub-circuit 10 writes at least the first data signal from the first data signal terminal D1 into the first driving sub-circuit 101 in response to the first scanning signal received from the first scanning signal terminal G1, and makes the first driving sub-circuit 101 output the driving signal according to the first data signal and the first power supply voltage signal from the first power supply voltage signal terminal S1 in response to the enable signal received from the enable signal terminal EM, so as to drive the element L to be driven to operate. The time control sub-circuit 20 writes the second data signal from the second data signal terminal D2 and the second voltage signal from the second voltage signal terminal V2 into the second driving sub-circuit 201 in response to the second scanning signal received from the second scanning signal terminal G2; and writes the first voltage signal varying within the set voltage range from the first voltage signal terminal V1 into the second driving sub-circuit 201, and makes the second driving sub-circuit 201 be electrically connected with the third voltage signal terminal V3 and the first driving sub-circuit 101, in response to the enable signal received from the enable signal terminal EM. The second driving sub-circuit 201 outputs the third voltage signal from the third voltage signal terminal V3 to the first driving sub-circuit 101 in response to the second data signal received from the second data signal terminal D2 and the change in voltage of the first voltage signal from the first voltage signal terminal V1, so as to make the first driving sub-circuit 101 stop outputting the driving signal, thereby controlling the operating duration of the element L to be driven. It can be seen that, the driving control sub-circuit 10 controls the magnitude of the driving signal transmitted to the element L to be driven, and the time control sub-circuit 20 controls the operating duration of the element L to be driven.

In this way, in a case where the element L to be driven performs displays of different gray scales, by controlling the magnitude of the driving signal input to the element L to be driven and the luminous duration of the element L to be driven, it may be possible to achieve a change of the luminous brightness of the element L to be driven, and then achieve a display of a corresponding gray scale, so as to achieve a large contrast. In a case where the element L to be driven is a micro inorganic light-emitting diode, in a case where the element L to be driven performs a display of a high gray scale, the pixel driving circuit may output a large driving current to the element L to be driven, and may control a luminous duration of the element L to be driven to be a long luminous duration. In a case where the element L to be driven performs a display of a low gray scale, the driving current output by the pixel driving circuit to the element L to be driven may be a large value (e.g., a current corresponding to a certain high gray scale), and the brightness of the element L to be driven may be reduced by shortening the luminous duration of the element L to be driven. Or, in a case where the element L to be driven performs the display of the low gray scale, the driving current output by the pixel driving circuit to the element L to be driven is maintained within a high value range (e.g., the driving current within the high value range is close to the current when the high gray scale display is performed), and the brightness of the element L to be driven may be reduced by shortening the luminous duration of the element L to be driven. Therefore, regardless of whether the element L to be driven performs the display of the high gray scale or the low gray scale, the driving current is always large, so that the element L to be driven is always at a high current density. As a result, the element L to be driven has a high luminous efficiency, a stable brightness, a lower power consumption, and a good display effect.

Figure 4:
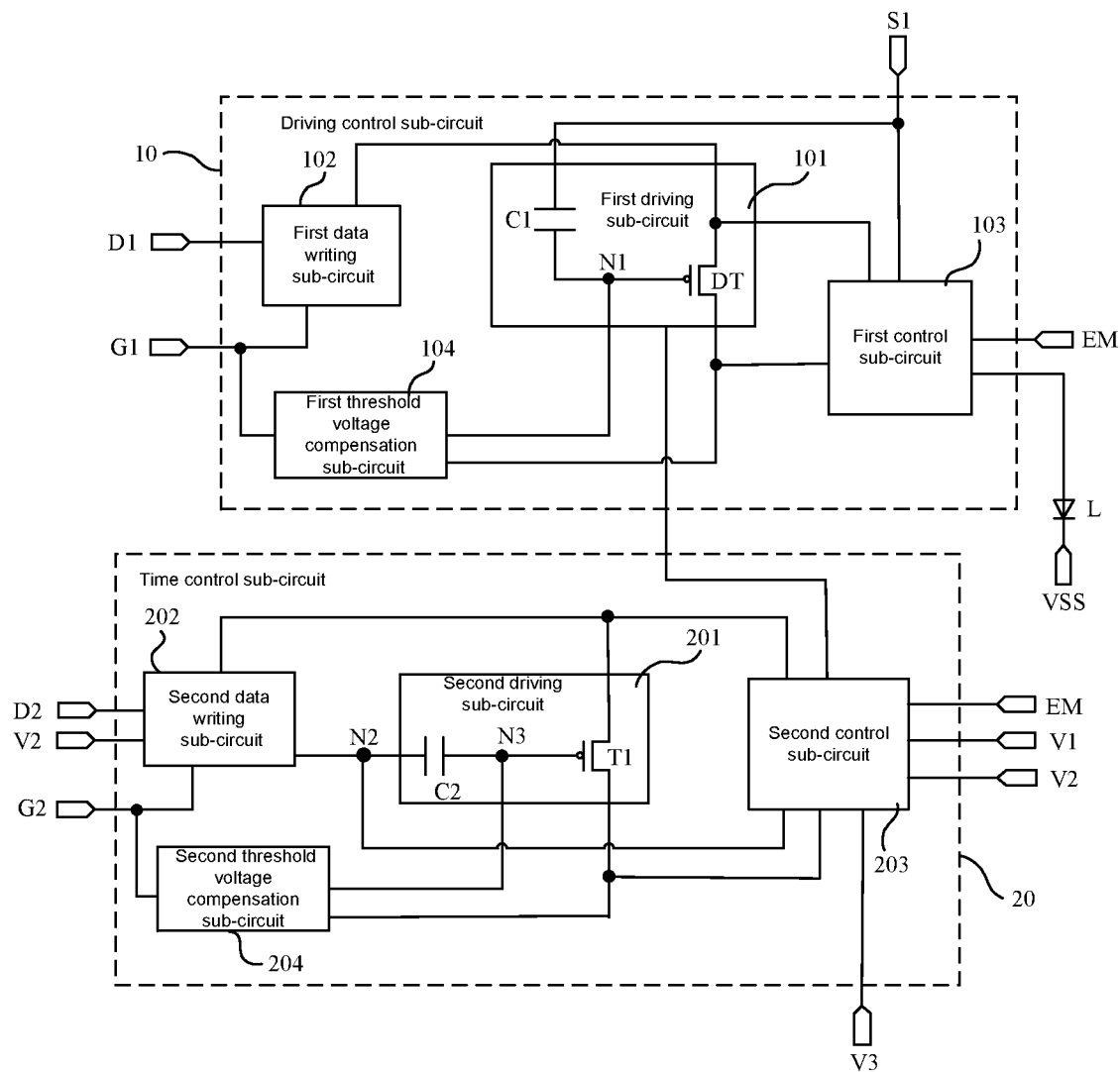
FIG. 4 is a structure! block diagram of another pixel driving circuit, in accordance with some embodiments.

In some embodiments, as shown in FIG. 4, the driving control sub-circuit 10 further includes a first data writing sub-circuit 102, a first threshold voltage compensation sub-circuit 104 and a first control sub-circuit 103.

The first driving sub-circuit 101 includes a driving transistor DT and a first capacitor C1. A second electrode of the first capacitor C1 is connected to a first node N1, and a first electrode of the first capacitor C1 is connected to the first power supply voltage signal terminal S1. A gate of the driving transistor DT is connected to the first node N1.

The first data writing sub-circuit 102 is connected to the first scanning signal terminal G1, the first data signal terminal D1, and a first electrode of the driving transistor DT. The first data writing sub-circuit 102 is configured to write the first data signal from the first data signal terminal D1 into the first electrode of the driving transistor DT in response to the first scanning signal received from the first scanning signal terminal G1. The first threshold voltage compensation sub-circuit 104 is connected to the first scanning signal terminal G1, a second electrode of the driving transistor DT, and the first node N1. The first threshold voltage compensation sub-circuit 104 is configured to transmit the first data signal from the first data signal terminal D1 and a threshold voltage of the driving transistor DT in the first driving sub-circuit 101 to the first node N1 in response to the first scanning signal received from the first scanning signal terminal G1, so as to perform a threshold voltage compensation on the driving transistor DT.

The first control sub-circuit 103 is connected to the enable signal terminal EM, the first power supply voltage signal terminal S1, the first electrode and the second electrode of the driving transistor DT, and the first electrode of the element L to be driven. The first control sub-circuit 103 is configured to make the first power supply voltage signal terminal S1 be electrically connected with the first electrode of the driving transistor DT, and make the second electrode of the driving transistor DT be electrically connected with the first electrode of the element L to be driven, in response to the enable signal received from the enable signal terminal EM.

In this way, the threshold voltage compensation of the driving transistor DT in the first driving sub-circuit 101 is achieved through the first threshold voltage compensation sub-circuit 104, and the effect of the threshold voltage of the driving transistor DT on the element L to be driven may be eliminated. It may be possible to avoid that the threshold voltage of the driving transistor DT is shifted due to the use of low temperature poly silicon (LTPS), which may affect the luminous effect of the element L to be driven.

It will be understood that, in a case where a driving transistor DT is a P-type transistor, the third voltage signal is a high-level signal. In a case where the driving transistor DT is an N-type transistor, the third voltage signal is a low-level signal.

Figure 5:
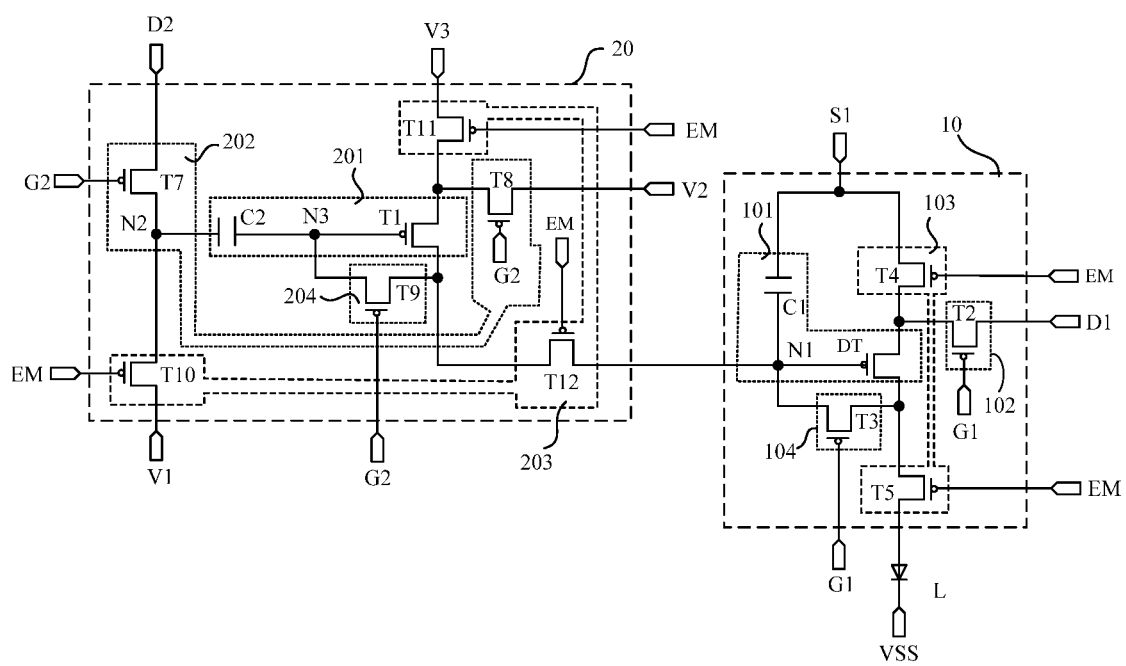
FIG. 5 is a circuit diagram of the pixel driving circuit in FIG. 4.

In some examples, as shown in FIG. 5, the first data writing sub-circuit 102 includes a second transistor T2. A gate of the second transistor T2 is connected to the first scanning signal terminal G1, a first electrode of the second transistor T2 is connected to the first data signal terminal D1, and a second electrode of the second transistor T2 is connected to the first electrode of the driving transistor DT.

In some examples, as shown in FIG. 5, the first threshold voltage compensation sub-circuit 104 includes a third transistor T3. A gate of the third transistor T3 is connected to the first scanning signal terminal G1, a first electrode of the third transistor T3 is connected to the second electrode of the driving transistor DT, and a second electrode of the third transistor T3 is connected to the first node N1.

In some examples, as shown in FIG. 5, the first control sub-circuit 103 includes a fourth transistor T4 and a fifth transistor T5. A gate of the fourth transistor T4 is connected to the enable signal terminal EM, a first electrode of the fourth transistor T4 is connected to the first power supply voltage signal terminal S1, and a second electrode of the fourth transistor T4 is connected to the first electrode of the driving transistor DT. A gate of the fifth transistor T5 is connected to the enable signal terminal EM, a first electrode of the fifth transistor T5 is connected to the second electrode of the driving transistor DT, and a second electrode of the fifth transistor T5 is connected to the first electrode of the element L to be driven.

Figure 6:
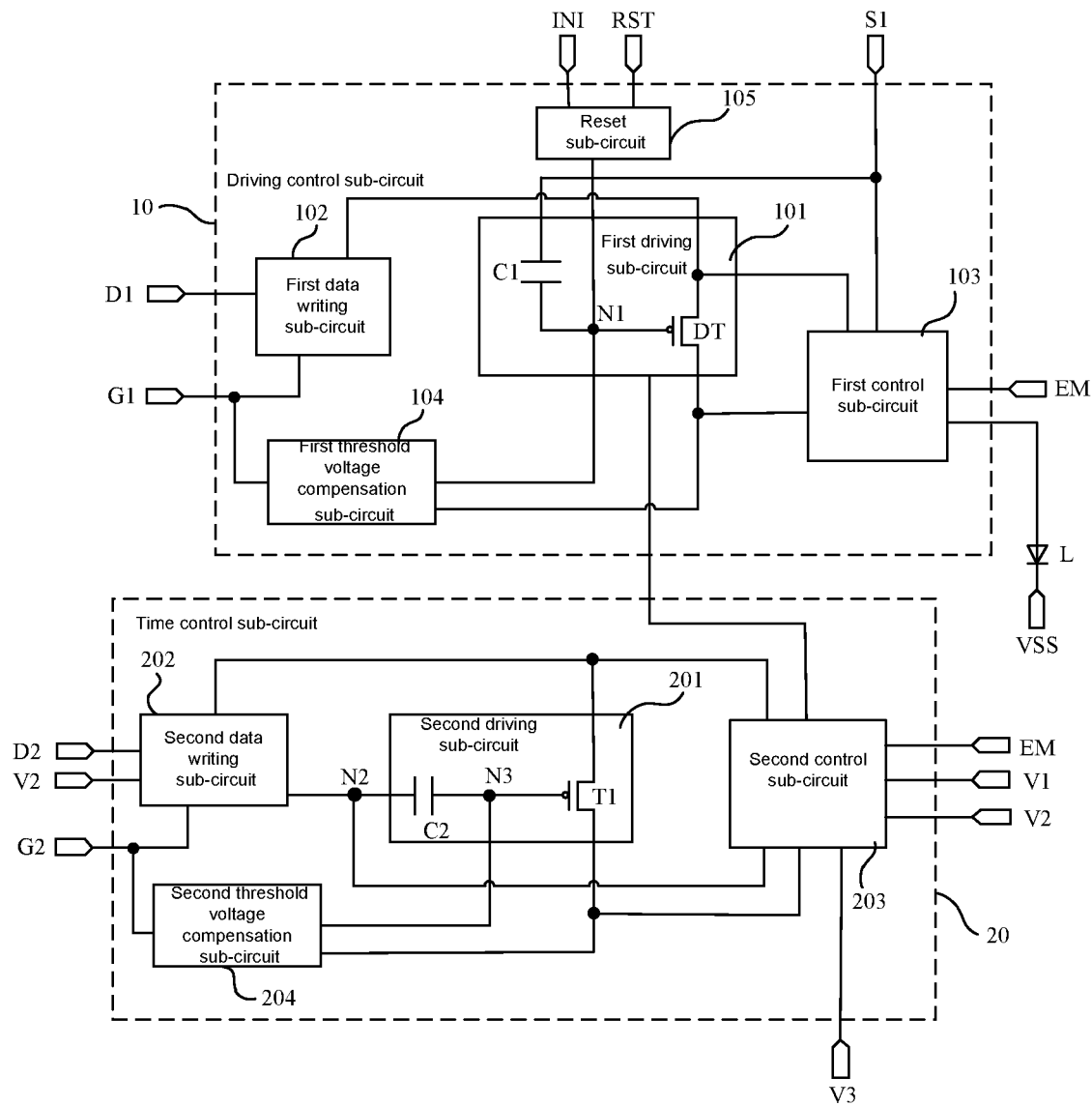
FIG. 6 is a structure block diagram of yet another pixel driving circuit, in accordance with some embodiments.

In some embodiments, as shown in FIG. 6, the driving control sub-circuit 10 further includes a reset sub-circuit 105. The reset sub-circuit 105 is connected to an initial signal terminal INI, a reset signal terminal RST, and the first driving sub-circuit 101. The reset sub-circuit 105 is configured to transmit an initial signal from the initial signal terminal INI to the first driving sub-circuit 101 in response to a reset signal received from the reset signal terminal RST, so as to reset the first driving sub-circuit 101.

Figure 7:
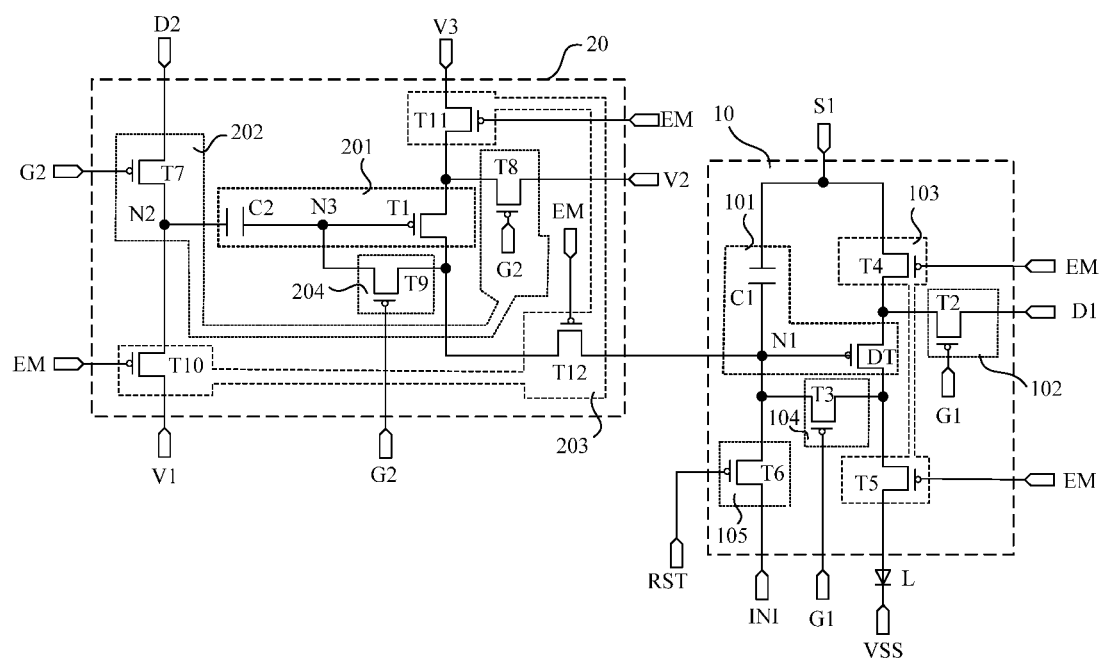
FIG. 7 is a circuit diagram of the pixel driving circuit in FIG. 6.

In some examples, as shown in FIG. 7, the reset sub-circuit 105 includes a sixth transistor T6. A gate of the sixth transistor T6 is connected to the reset signal terminal RST, and a first electrode of the sixth transistor T6 is connected to the initial signal terminal INI, and a second electrode of the sixth transistor T6 is connected to the gate of the driving transistor DT in the first driving sub-circuit 101.

On this basis, since the second electrode of the first capacitor C1 and the gate of the driving transistor DT are both connected to the first node N1, while the reset sub-circuit 105 resets the gate of the driving transistor DT, the second electrode of the first capacitor C1 is also reset, thereby achieving the noise reduction of the first driving sub-circuit 101.

In some embodiments, as shown in FIG. 4, the time control sub-circuit 20 includes the second driving sub-circuit 201, a second data writing sub-circuit 202, a second threshold voltage compensation sub-circuit 204 and a second control sub-circuit 203.

The second driving sub-circuit 201 includes a first transistor T1 and a second capacitor C2. A first electrode of the second capacitor C2 is connected to a second node N2, and a second electrode of the second capacitor C2 is connected to a third node N3. A gate of the first transistor T1 is connected to the third node N3.

The second data writing sub-circuit 202 is connected to the second scanning signal terminal G2, the second voltage signal terminal V2, the second data signal terminal D2, the second node N2, and a first electrode of the first transistor T1. The second data writing sub-circuit 202 is configured to write the second data signal from the second data signal terminal D2 into the second node N2 and write the second voltage signal from the second voltage signal terminal V2 into the first electrode of the first transistor T1, in response to the second scanning signal received from the second scanning signal terminal G2.

The second threshold voltage compensation sub-circuit 204 is connected to the second scanning signal terminal G2, a second electrode of the first transistor T1, and the third node N3. The second threshold voltage compensation sub-circuit 204 is configured to transmit the second voltage signal from the second voltage signal terminal V2 and a threshold voltage of the first transistor T1 in the second driving sub-circuit 201 to the third node N3 in response to the second scanning signal received from the second scanning signal terminal G2. The second control sub-circuit 203 is connected to the enable signal terminal EM, the first voltage signal terminal V1, the third voltage signal terminal V3, the second node N2, the first node N1, and the first electrode and the second electrode of the first transistor T1. The second control sub-circuit 203 is configured to transmit the first voltage signal varying within the set voltage range from the first voltage signal terminal V1 to the second node N2 and make the first transistor T1 be electrically connected with the third voltage signal terminal V3 and the first driving sub-circuit 101, in response to the enable signal received from the enable signal terminal EM, so as to control the operating duration of the element L to be driven.

In a case where the first driving sub-circuit 101 includes the driving transistor DT, and the gate of the driving transistor DT is connected to the first node N1, the second control sub-circuit 203 is connected to the first driving sub-circuit 101. That is, the second control sub-circuit 203 is connected to the first node N1. Correspondingly, the second control sub-circuit 203 is configured to make the first transistor T1 be connected with the first driving sub-circuit 101 in response to the received enable signal. That is, the second control sub-circuit 203 is configured to make the first transistor T1 be connected with the first node N1 in response to the received enable signal.

The voltage of the first voltage signal changes with time within the set voltage range, and the set voltage range is determined according to the operating duration of the element L to be driven. Therefore, by changing the voltage of the first voltage signal that changes within the set voltage range, it may be possible to achieve a control on the luminous duration of the element L to be driven, thereby achieving a control of the gray scale.

In the time control sub-circuit 20 provided by some embodiments of the present disclosure, the second data writing sub-circuit 202 writes the second data signal from the second data signal terminal D2 into the second node N2, and the second threshold voltage compensation sub-circuit 204 transmits the second voltage signal and the threshold voltage of the first transistor T1 to the third node N3, so that a voltage of the first electrode of the second capacitor C2 is the same as the voltage of the second data signal (denoted as $V_{data2}$). A voltage of the second electrode of the second capacitor C2 is a sum of the voltage of the second voltage signal (denoted as $V_{V2}$) and the voltage of the threshold voltage of the first transistor T1 (denoted as $V_{th1}$). On this basis, the second control sub-circuit 203 transmits the first voltage signal, from the first voltage signal terminal V1, whose voltage changes within the set voltage range to the second node N2, so that the voltage of the second node N2 (i.e., the first electrode of the second capacitor C2) changes from the voltage $V_{data2}$ of the second data signal to a voltage of the first voltage signal (denoted as $V_{V1}$). According to the law of conservation of charge of the capacitor, a voltage difference across the second capacitor C2 remains unchanged. When a voltage of the second node N2 changes from $V_{data2}$ to $V_{V1}$, a voltage of the third node N3 (i.e., the second electrode of the second capacitor C2) will change as the voltage of the second node N2 changes. That is, the voltage of the third node N3 becomes ($V_{V2}+V_{th1}+(V_{V1}-V_{data2})$).

Since the voltage of the first voltage signal changes within the set voltage range, when the voltage of the third node N3 changes to a certain value, the first transistor T1 is turned on. In this case, the first transistor T1 is electrically connected with the gate (i.e., the first node N1) of the driving transistor DT in the first driving sub-circuit 101 and the third voltage signal terminal V3, and transmits the third voltage signal from the third voltage signal terminal V3 to the gate of the driving transistor DT through the first transistor T1, so that the driving transistor DT is turned off. Since whether the driving signal can be transmitted to the element L to be driven is determined by whether the first transistor T1 is turned on or not, it may be possible to control whether the first transistor T1 is turned on or not though a changed first voltage signal, so as to achieve the control of the operating duration of the element L to be driven.

In some examples, as shown in FIG. 5, the second data writing sub-circuit 202 includes a seventh transistor T7 and an eighth transistor T8. A gate of the seventh transistor T7 is connected to the second scanning signal terminal G2, a first electrode of the seventh transistor T7 is connected to the second data signal terminal D2, and a second electrode of the seventh transistor T7 is connected to the second node N2. A gate of the eighth transistor T8 is connected to the second scanning signal terminal G2, a first electrode of the eighth transistor T8 is connected to the second voltage signal terminal V2, and a second electrode of the eighth transistor T8 is connected to the first electrode of the first transistor T1.

In some examples, as shown in FIG. 5, the second threshold voltage compensation sub-circuit 204 includes a ninth transistor T9. A gate of the ninth transistor T9 is connected to the second scanning signal terminal G2, a first electrode of the ninth transistor T9 is connected to the second electrode of the first transistor T1, and a second electrode of the ninth transistor T9 is connected to the third node N3.

In some examples, as shown in FIG. 5, the second control sub-circuit 203 includes a tenth transistor T10, an eleventh transistor T11, and a twelfth transistor T12. A gate of the tenth transistor T10 is connected to the enable signal terminal EM, a first electrode of the tenth transistor T10 is connected to the first voltage signal terminal V1, and a second electrode of the tenth transistor T10 is connected to the second node N2. A gate of the eleventh transistor T11 is connected to the enable signal terminal EM, a first electrode of the eleventh transistor T11 is connected to the third voltage signal terminal V3, and a second electrode of the eleventh transistor T11 is connected to the first electrode of the first transistor T1. A gate of the twelfth transistor T12 is connected to the enable signal terminal EM, a first electrode of the twelfth transistor T12 is connected to the second electrode of the first transistor T1, and a second electrode of the twelfth transistor T12 is connected to the first node N1.

In the embodiments of the present disclosure, the first electrode is one of source and drain of the transistor, and the second electrode is the other of the source and the drain of the transistor. Since the source and the drain of the transistor may be symmetrical in structure, there may be no difference in structure between the source and the drain of the transistor. That is, there may be no difference in structure between the first electrode and the second electrode of the transistor in the embodiments of the present disclosure. For example, for the P-type transistor, the second electrode is referred to as the drain, and the first electrode is referred to as the source. For another example, for the N-type transistor, the first electrode is referred to as the drain, and the second electrode is referred to as the source.

In addition, the transistor may be divided into an enhancement transistor and a depletion transistor according to different conduction modes of the transistor. Each transistor in the embodiments of the present disclosure may be the enhancement transistor or the depletion transistor, which is not limited.

Figure 8:
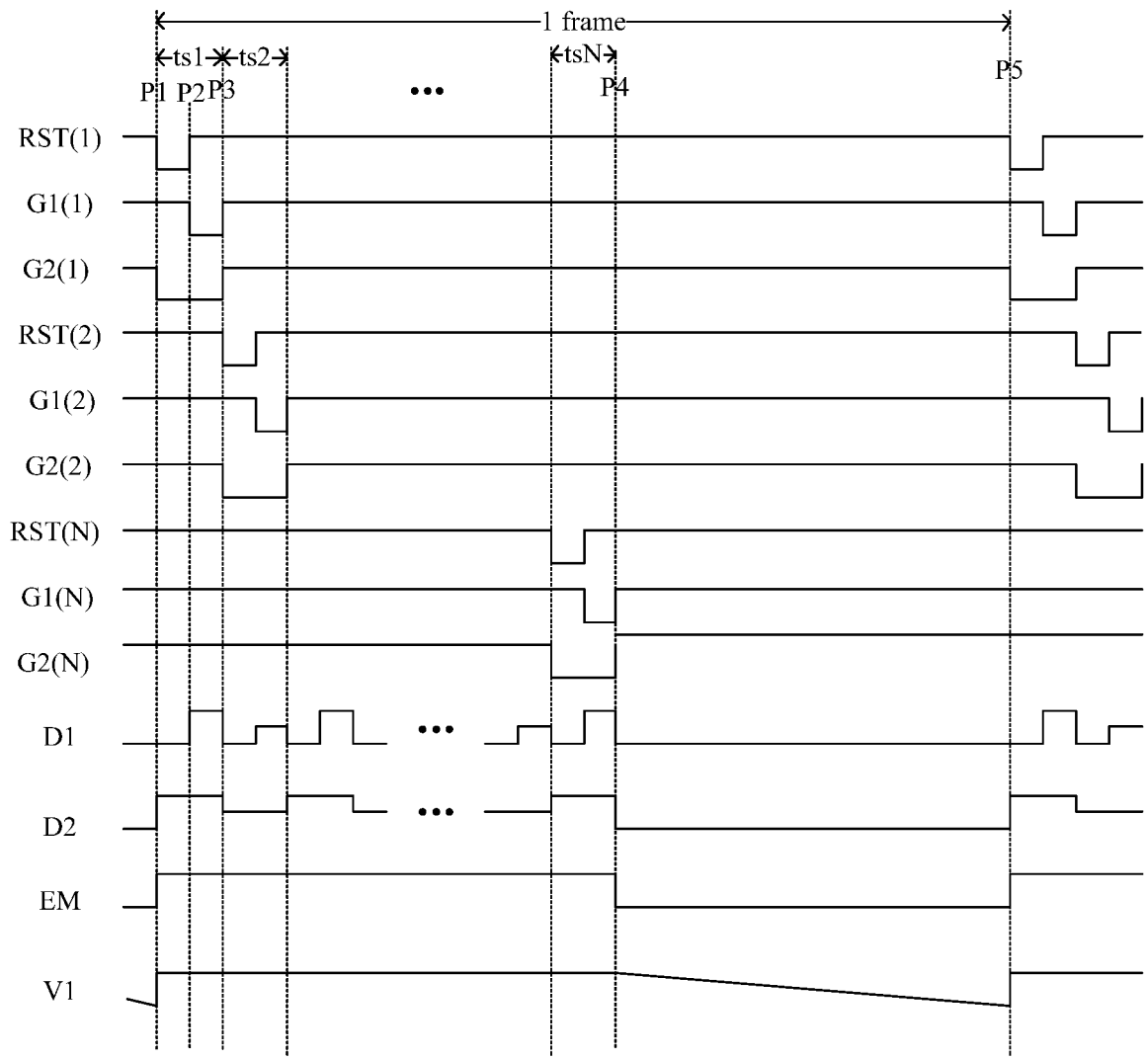
FIG. 8 is a signal timing diagram of a pixel driving circuit, in accordance with some embodiments.

On this basis, operating conditions of the pixel driving circuit shown in FIG. 7 at different phases are exemplarily illustrated with reference to FIG. 8 (FIG. 8 showing a signal timing diagram of the pixel driving circuit in FIG. 7). FIG. 7 illustrates an example in which the transistors in sub-circuits in the pixel driving circuits shown in FIG. 7 are all P-type transistors.

As shown in FIG. 8, a frame period includes a scanning phase (P1 to P4) and an operating phase (P4 to P5). The scanning phase (P1 to P4) includes a plurality of row scanning phases. In a case where the plurality of pixel driving circuits in the display panel are disposed in sub-pixel regions P of N rows and M columns, the plurality of row scanning phases include N row scanning phases. The N row scanning phases are ts1 to tsN. The first row scanning phase is ts1, the second row scanning phase is ts2, and the N-th row scanning phase is tsN, and N is an integer not less than 2.

In the scanning phase (P1 to P4), pixel driving circuits in rows of sub-pixel regions P are scanned row by row. That is, starting from the pixel driving circuits located in the first row of sub-pixel regions P, pixel driving circuits are scanned row by row, and the first data signals and the second data signals are input to the pixel driving circuits in each row of sub-pixel regions P in sequence, and so on until the first data signals and the second data signals are input to pixel driving circuits located in the N-th row of sub-pixel regions P.

In some embodiments, after scanning the pixel driving circuits in rows of sub-pixel regions P row by row, the operating phase (P4 to P5) is started.

In some examples, the pixel driving circuits in rows of sub-pixel regions P may enter the operating phase in sequence. That is, firstly the pixel driving circuits in the first row of sub-pixel regions P enter the operating phase, then the pixel driving circuits in the second row of sub-pixel regions P enter the operating phase, . . . , and finally the pixel driving circuits in the N-th row of sub-pixel regions P enter the operating phase. Effective duration of enable signals of the pixel driving circuits in rows of sub-pixel regions P in the operating phase is the same.

In some other examples, the pixel driving circuits in rows of sub-pixel regions P enter the operating phase synchronously.

In some other embodiments, the pixel driving circuits in each row of sub-pixel regions P enter the operating phase after a corresponding row scanning phase ends. In each row scanning phase, pixel driving circuits in M sub-pixel regions located in a same row are synchronously written with different or the same first data signals. That is, the first data signals are a group of signals. The pixel driving circuits in the M sub-pixel regions located in the same row are synchronously written with different or the same second data signals. That is, the second data signals are a group of signals.

The following description will be made by taking an example in which the pixel driving circuit is located in the first sub-pixel region P of the first row and an element L to be driven in connect with the pixel driving circuit is the current mode light-emitting diode.

As shown in FIG. 8, in the first row scanning phase ts1 of the scanning phase (P1 to P4), the pixel driving circuit located in the first sub-pixel region P of the first row includes the following driving processes.

Figure 9:
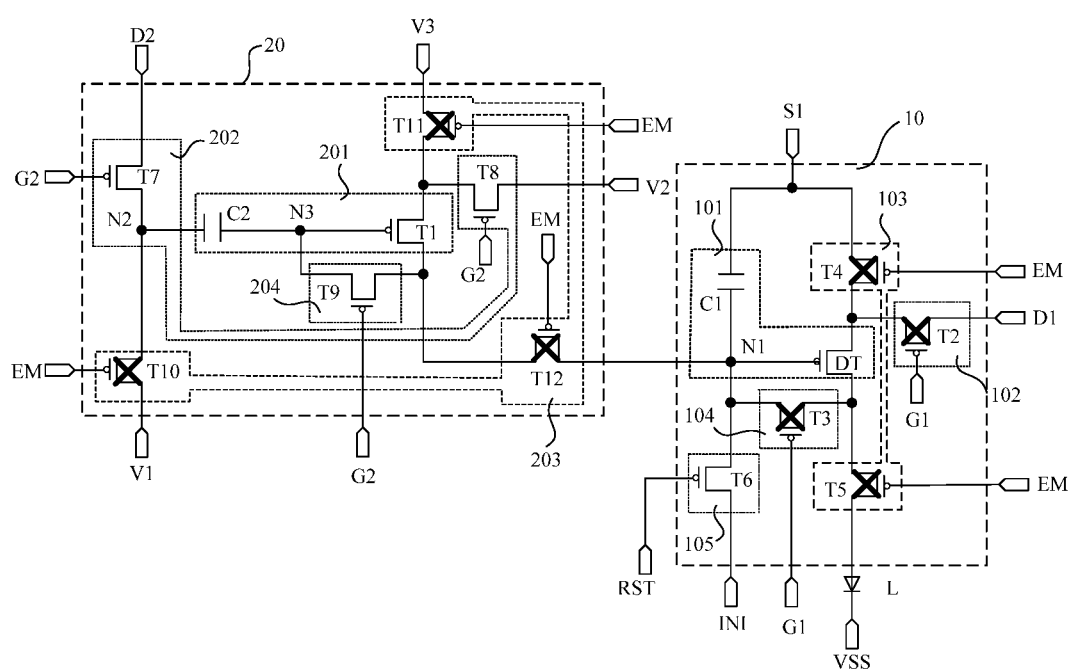
FIG. 9 is a schematic diagram of a driving process of the pixel driving circuit in FIG. 7.

In the first phase (P1 to P2), as shown in FIG. 9, the sixth transistor T6 is turned on in response to the reset signal received from the reset signal terminal RST to transmit the initial signal from the initial signal terminal INI to the first node N1, so as to reset the first node N1. In this case, a voltage of the first node N1 is a voltage of the initial signal (denoted as $V_{init}$). In this case, the second electrode of the first capacitor C1 and the gate of the driving transistor DT that are electrically connected with the first node N1 are also reset to $V_{init}$.

The initial signal provided by the initial signal terminal INI is capable of eliminating the effect of signal of the previous frame on the first node N1. In some examples, the initial signal is the low-level signal. When the reset sub-circuit 105 is working, the initial signal resets the first node N1, and makes the driving transistor DT in a seemingly on but off state, which is convenient for writing signals in the next phase.

In the first phase (P1 to P2), as shown in FIG. 9, the seventh transistor T7 is turned on in response to the second scanning signal received from the second scanning signal terminal G2 to write the second data signal from the second data signal terminal D2 into the second node N2, so that the voltage of the second node N2 is the voltage $V_{data2}$ of the second data signal. Since the first electrode of the second capacitor C2 is electrically connected to the second node N2, the voltage of the first electrode of the second capacitor C2 is the same as the voltage of the second data signal from the second data signal terminal D2. That is, the voltage of the first electrode of the second capacitor C2 is $V_{data2}$.

As shown in FIG. 9, the eighth transistor T8 is turned on in response to the second scanning signal received from the second scanning signal terminal G2 to transmit the second voltage signal from the second voltage signal terminal V2 to the first electrode of the first transistor T1. In this case, a voltage of the first electrode of the first transistor T1 is the voltage Vv2 of the second voltage signal from the second voltage signal terminal V2.

As shown in FIG. 9, the ninth transistor T9 is turned on in response to the second scanning signal received from the second scanning signal terminal G2 to short-circuit the gate and the second electrode of the first transistor T1. In this way, the first transistor T1 is in a saturated state. A voltage of the gate of the first transistor T1 is a sum of the voltage of the first electrode thereof and the threshold voltage $V_{th1}$ thereof. In this case, the voltage of the gate of the first transistor T1 is a sum of the voltage $V_{V2}$ of the second voltage signal from the second voltage signal terminal V2 and the threshold voltage $V_{th1}$ of the first transistor T1, i.e., $(V_{V2}+V_{th1})$. In this case, the voltage of the third node N3 electrically connected with the gate of the first transistor T1 is also $(V_{V2}+V_{th1})$.

On this basis, the voltage of the second electrode, electrically connected with the third node N3, of the second capacitor C2 is $(V_{V2}+V_{th1})$. The voltage of the first electrode of the second capacitor C2 is $V_{data2}$. That is, two electrodes of the second capacitor C2 are each charged, and they have a voltage difference $(V_{data2}-V_{V2}-V_{th1})$ therebetween.

In addition, the first scanning signal from the first scanning signal terminal G1 and the enable signal from the enable signal terminal EM are both high-level signals in the first phase (P1 to P2). Therefore, the second transistor T2, the third transistor T3, the fourth transistor T4, the fifth transistor T5, the tenth transistor T10, the eleventh transistor T11, and the twelfth transistor T12 are all in the off state. In this case, the element L to be driven does not operate.

Figure 10:
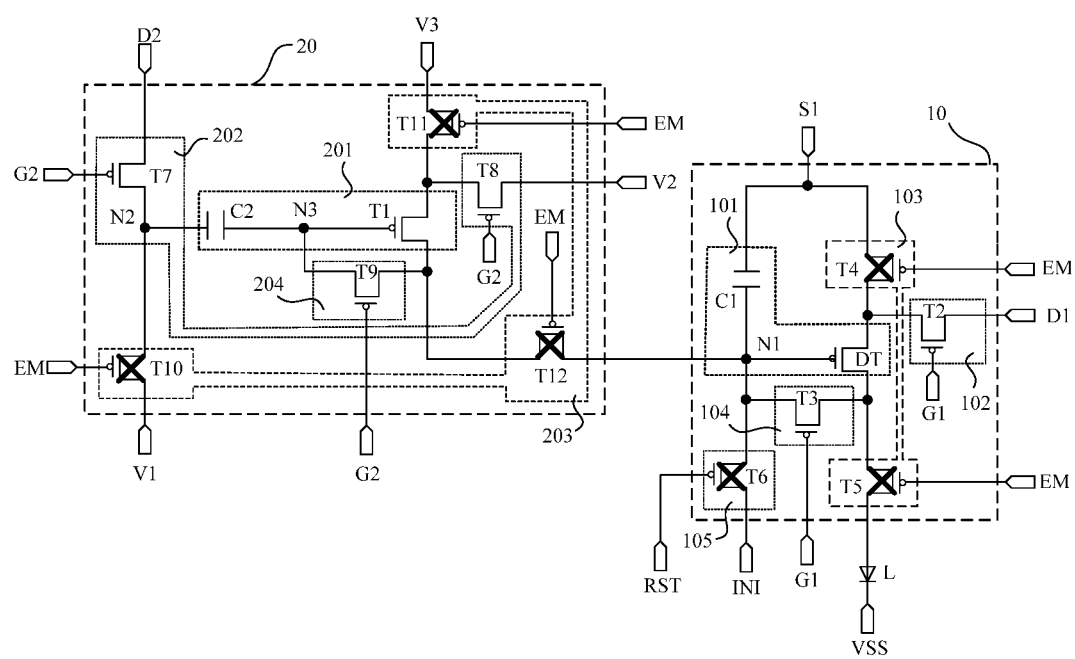
FIG. 10 is a schematic diagram of another driving process of the pixel driving circuit in FIG. 7.

In the second phase (P2 to P3), as shown in FIG. 10, the second transistor T2 is turned on in response to the first scanning signal received from the first scanning signal terminal G1 to write the first data signal from the first data signal terminal D1 into the first electrode of the driving transistor DT, so that a voltage of the first electrode of the driving transistor DT is the voltage of the first data signal (denoted as $V_{data1}$).

As shown in FIG. 10, the third transistor T3 is turned on in response to the first scanning signal received from the first scanning signal terminal G1 to short-circuit the gate and the second electrode of the driving transistor DT. In this way, the driving transistor DT is in a saturated state. A voltage of the gate of the driving transistor DT is a sum of the voltage of the first electrode thereof and the threshold voltage thereof (denoted as $V_{thd}$). Since the voltage of the first electrode of the driving transistor DT is $V_{data1}$, the voltage of the gate of the driving transistor DT is a sum of the voltage $V_{data1}$ of the first data signal and the threshold voltage $V_{thd}$ of the driving transistor DT, i.e., $(V_{data1}+V_{thd})$. In this case, the voltage of the first node N1 electrically connected with the gate of the driving transistor DT is also $(V_{data1}+V_{thd})$.

In this case, a voltage of the second electrode, electrically connected with the first node N1, of the first capacitor C1 is $(V_{data1}+V_{thd})$. A voltage of the first electrode of the first capacitor C1 is a voltage of the first power supply voltage signal from the first power supply voltage signal terminal S1 (denoted as $V_{S1}$). That is, two electrodes of the first capacitor C1 are each charged, and they have a voltage difference $(V_{S1}-V_{data1}-V_{thd})$ therebetween.

In the second phase (P2 to P3), the time control sub-circuit 20 still performs the writing of the second data signal, which may be referred to the description of a writing process of the second data signal performed by the time control sub-circuit 20 in the first phase (P1 to P2).

In addition, the enable signal from the enable signal terminal EM and the reset signal from the reset signal terminal RST are both high-level signals in the second phase (P2 to P3). Therefore, the fourth transistor T4, the fifth transistor T5, the sixth transistor T6, the tenth transistor T10, the eleventh transistor T11, and the twelfth transistor T12 are all in the off state. In this case, the element L to be driven does not operate.

It will be noted that, in some embodiments, in addition to the time control sub-circuit 20 performing the writing process of the second data signal in both the first phase (P1 to P2) and the second phase (P2 to P3), in the embodiments of the present disclosure, the time control sub-circuit 20 may not perform the writing process of the second data signal while the driving control sub-circuit 10 is reset, and the time control sub-circuit 20 performs the writing process of the second data signal while the driving control sub-circuit 10 performs a writing process of the first data signal. That is, the time control sub-circuit 20 performs the writing process of the second data signal only in the second phase (P2 to P3). In some other embodiments, the time control sub-circuit 20 performs the writing process of the second data signal while the driving control sub-circuit 10 is reset, and the time control sub-circuit 20 does not perform the writing process of the second data signal while the driving control sub-circuit 10 performs the writing process of the first data signal. That is, the time control sub-circuit 20 performs the writing process of the second data signal only in the first phase (P1 to P2).

After the first row scanning phase ts1 ends, the pixel driving circuits in the second row of sub-pixel regions P are scanned in the second row scanning phase ts2, and so on until the pixel driving circuits in the N-th row of sub-pixel regions are scanned in the N-th row scanning phase tsN. As shown in FIG. 8, starting from an end moment (P3) of the first row scanning phase ts1, within the time period P3 to P4, pixel driving circuits located in the second row to the N-th row of sub-pixel regions P are scanned row by row.

Driving processes of the pixel driving circuits located in the second row to the N-th row of sub-pixel regions P in corresponding row scanning phases are consistent with a driving process of the pixel driving circuits located in the first row of sub-pixel regions P in the first row scanning phase ts1, which will not be repeated herein. That is, in the entire scanning phase (P1 to P4), driving processes of both the first phase and second phase need to be executed N times.

In summary, in the entire scanning phase (P1 to P4), each row scanning phase of the N row scanning phases includes the first phase and the second phase. Therefore, the first data signals and the second data signals may be written to the pixel driving circuits in the N rows of sub-pixel regions P, and the first data signal and the second data signal may be stored, so as to prepare for the operating phase (P4 to P5).

In some examples, after scanning the pixel driving circuits in the N rows of sub-pixel regions P row by row, the pixel driving circuits in rows of sub-pixel regions P enter the operating phase (P4 to P5).

In the operating phase (P4 to P5), the pixel driving circuit located in the first sub-pixel region P of the first row includes the following processes.

Figure 11:
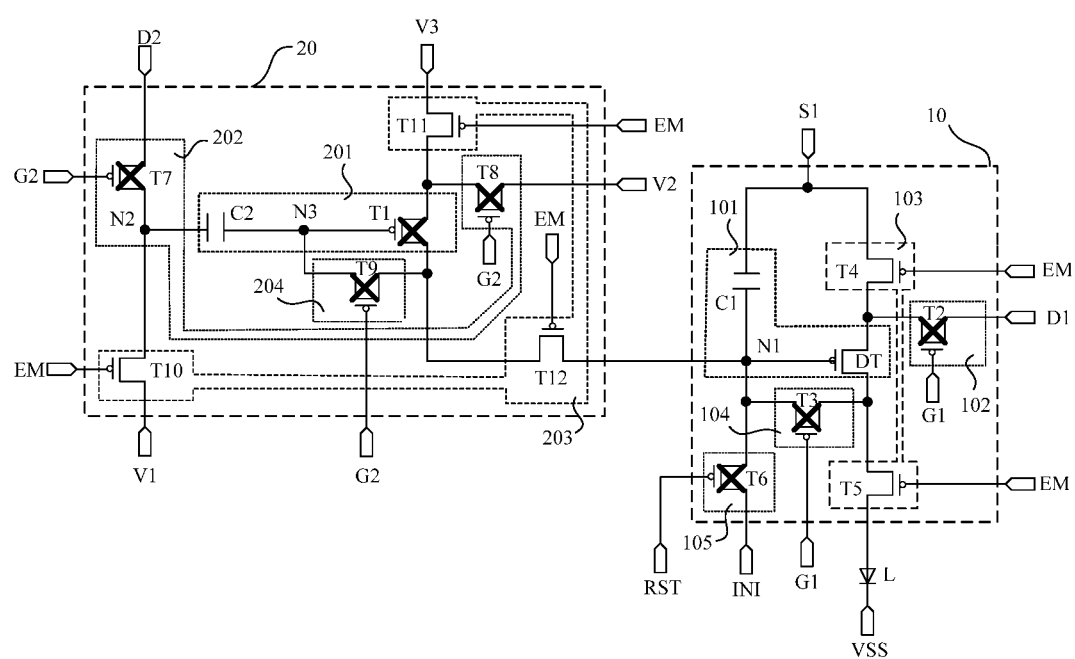
FIG. 11 is a schematic diagram of yet another driving process of the pixel driving circuit in FIG. 7.

As shown in FIGS. 8 and 11, in the driving control sub-circuit 10, the fourth transistor T4 and the fifth transistor T5 are turned on in response to the enable signal received from the enable signal terminal EM. The first power supply voltage signal from the first power supply voltage signal terminal S1 is transmitted to the first electrode of the driving transistor DT through the turned-on fourth transistor T4. In this case, the voltage of the first electrode of the driving transistor DT is the voltage $V_{S1}$ of the first power supply voltage signal, and the first electrode of the driving transistor DT is the source. That is, a voltage of a source of the driving transistor DT is the voltage $V_{S1}$ of the first power supply voltage signal.

Since the voltage of the gate of the driving transistor DT is $V_{data1}+V_{thd}$, and the voltage of the source of the driving transistor DT is $V_{S1}$, a gate-source voltage difference $V_{gs}$ of the driving transistor DT (i.e., a difference between the voltage of the gate and the voltage of the source of the driving transistor DT) is equal to $V_{data1}+V_{thd}-V_{S1}$ ($V_{gs}=V_{data1}+V_{thd}-V_{S1}$). In this case, the driving transistor DT is turned on when the gate-source voltage difference thereof is less than the threshold voltage thereof. That is, when ($V_{data1}+V_{thd}-V_{S1}$) is less than $V_{thd}$ (i.e., $V_{data1}+V_{thd}-V_{S1}<V_{thd}$), the driving transistor DT is turned on and generates a driving current. The driving current is output from the second electrode of the driving transistor DT, and is transmitted to the element L to be driven through the turned-on fifth transistor T5, so as to drive the element L to be driven to emit light.

The driving current I flowing through the driving transistor DT is equal to $K\times(V_{gs}-V_{thd})^2$, and is equal to $K\times(V_{data1}+V_{thd}-V_{S1}-V_{thd})^2$, and is equal to $K\times(V_{data1}-V_{S1})^2$ (i.e., $I=K\times(V_{gs}-V_{thd})^2=K\times(V_{data1}+V_{thd}-V_{S1}-V_{thd})^2=K\times(V_{data1}-V_{S1})^2$). K is equal to ½×W/L×C×u (i.e., K=½×W/L×C×u), wherein W/L is a width-to-length ratio of the driving transistor DT, C is a capacitance of a channel insulating layer, and u is a channel carrier mobility.

It can be seen that, the parameters are only related to the structure of the driving transistor DT. Therefore, the driving current flowing through the driving transistor DT is only related to the voltage $V_{data1}$ of the first data signal from the first data signal terminal D1 and the voltage $V_{S1}$ of the first power supply voltage signal from the first power supply voltage signal terminal S1, and is not related to the threshold voltage $V_{thd}$ of the driving transistor DT.

On this basis, when the element L to be driven in sub-pixel regions P perform displays of different gray scales, since a same first power supply voltage signal may be input to the pixel driving circuits in sub-pixel regions P, and the first power supply voltage signal may be set as the constant level signal, an amplitude of the driving current flowing through the element L to be driven may be controlled by controlling the first data signal.

Figure 12:
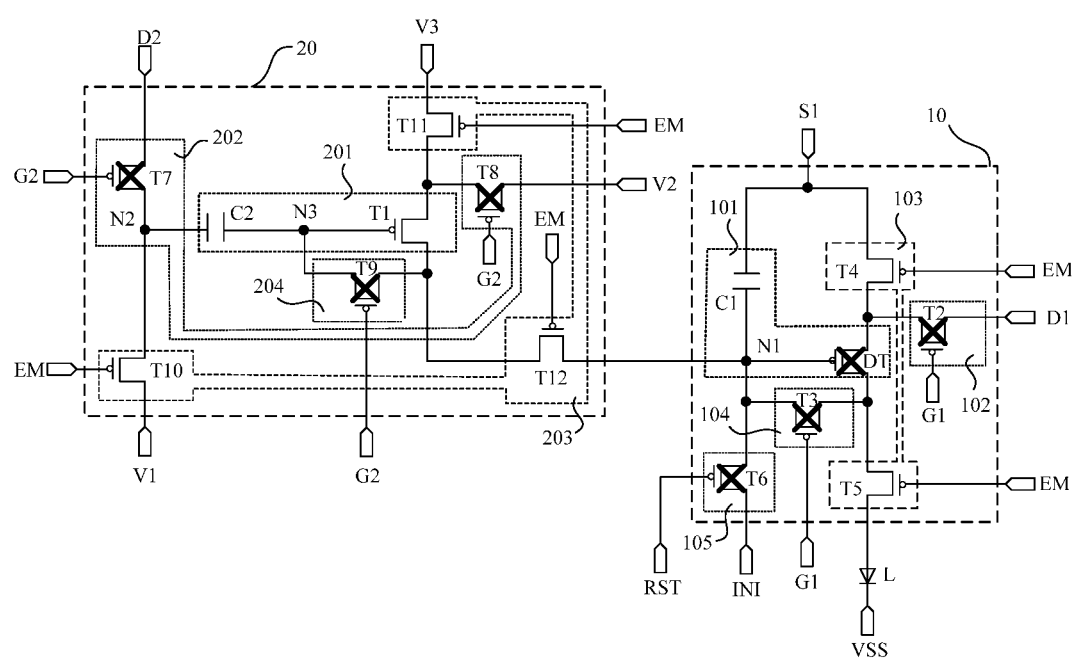
FIG. 12 is a schematic diagram of yet another driving process of the pixel driving circuit in FIG. 7.

Referring to FIGS. 8 and 12, in the time control sub-circuit 20, the tenth transistor T10 and the eleventh transistor T11 are turned on in response to the enable signal received from the enable signal terminal EM. The first voltage signal, from the first voltage signal terminal V1, whose voltage changes within the set voltage range is transmitted to the second node N2 through the turned-on tenth transistor T10, so that the voltage of the second node N2 is the voltage $V_{V1}$ of the first voltage signal. Since the first electrode of the second capacitor C2 is electrically connected to the second node N2, the voltage of the first electrode of the second capacitor C2 is also the voltage $V_{V1}$ of the first voltage signal from the first voltage signal terminal V1. According to the law of conservation of charge of the capacitor, the voltage difference between the first electrode and the second electrode of the second capacitor C2 remains unchanged. Before the first voltage signal from the first voltage signal terminal V1 is transmitted to the first electrode of the second capacitor C2, the voltage difference between the first electrode and the second electrode of the second capacitor C2 is ($V_{data2}-V_{V2}-V_{th1}$). Therefore, in the operating phase, when the voltage of the first electrode of the second capacitor C2 changes from the voltage $V_{data2}$ of the second data signal to the voltage $V_{V1}$ of the first voltage signal, the voltage of the second electrode of the second capacitor C2 is ($V_{V1}-V_{data2}+V_{V2}+V_{th1}$).

Since the voltage $V_{V1}$ of the first voltage signal provided by the first voltage signal terminal V1 changes within the set voltage range, the voltage of the third node N3 and the voltage of the gate of the first transistor T1 both change as the voltage $V_{V1}$ of the first voltage signal changes. Suppose that the voltage of the first voltage signal at moment t is $V_{V1}(t)$, in this case, the voltage $V_{N3}(t)$ of the third node N3 is equal to $V_{V1}(t)-V_{data2}+V_{V2}+V_{th1}$, and is equal to $V_{V1}(t)-\Delta V_{N3}$ (i.e., $V_{N3}(t)=V_{V1}(t)-V_{data2}+V_{V2}+V_{th1}=V_{V1}(t)-\Delta V_{N3}$), wherein $\Delta V_{N3}$ is equal to ($V_{data2}-V_{V2}-V_{th1}$) (i.e., $\Delta V_{N3}=V_{data2}-V_{V2}-V_{th1}$). It can be seen that, the voltage $V_{N3}$ of the third node N3 changes with the voltage $V_{V1}$ of the first voltage signal by a change amount $\Delta V_{N3}$, and a change speed is determined by the first voltage signal. On this basis, the third voltage signal from the third voltage signal terminal V3 is transmitted to the first electrode of the first transistor T1 through the turned-on eleventh transistor T11, so that the voltage of the first electrode of the first transistor T1 is a voltage of the third voltage signal from the third voltage signal terminal V3 (denoted as $V_{V3}$). That is, the voltage of the source of the first transistor T1 is $V_{V3}$. Therefore, when the gate-source voltage difference (denoted as $V_{gs1}$) of the first transistor T1 is less than the threshold voltage $V_{th1}$ thereof, the first transistor T1 is turned on. That is, $V_{gs1}$ is equal to ($V_{V1}(t)-V_{data2}+V_{V2}+V_{th1}-V_{V3}$) (i.e., $V_{gs1}=V_{V1}(t)-V_{data2}+V_{V2}+V_{th1}-V_{V3}$).

In some embodiments, the second voltage signal terminal V2 and the third voltage signal terminal V3 are a same terminal. That is, the voltage $V_{V2}$ of the second voltage signal is equal to the voltage $V_{V3}$ of the third voltage signal. In this case, $V_{gs1}$ is equal to ($V_{V1}(t)-V_{data2}+V_{th1}$) (i.e., $V_{gs1}=V_{V1}(t)-V_{data2}+V_{th1}$).

In this case, when the gate-source voltage difference $V_{gs1}$ of the first transistor T1 is equal to ($V_{V1}(t)-V_{data2}+V_{th1}$), and is less than $V_{th1}$ (i.e., $V_{gs1}=V_{V1}(t)-V_{data2}+V_{th1}<V_{th1}$), the first transistor T1 is turned on. It may be known that, whether the first transistor T1 is turned on is independent of its threshold voltage $V_{th1}$.

As shown in FIG. 12, the twelfth transistor T12 is turned on in response to the enable signal received from the enable signal terminal EM, so that the second electrode of the first transistor T1 is electrically connected to the first node N1. The third voltage signal from the third voltage signal terminal V3 is transmitted to the first node N1 through the turned-on eleventh transistor T11, the turned-on first transistor T1 and the turned-on twelfth transistor T12, so that the voltage of the first node N1 is the voltage $V_{V3}$ of the third voltage signal. Since the gate of the driving transistor DT in the driving control circuit 10 is connected to the first node N1, the third voltage signal from the third voltage signal terminal V3 is transmitted to the gate of the driving transistor DT. The third voltage signal is the high-level signal, and the driving transistor DT is turned off, so that the driving current cannot be transmitted to the element L to be driven, and the element L to be driven does not operate, thereby achieving the control of the operating duration of the element L to be driven.

When the element L to be driven perform displays of different gray scales, the voltage $V_{data2}$ of the second data signal provided by the second data signal terminal D2 may be controlled to be different, so that the time for the voltage $V_{V1}$ of the first voltage signal changing to the voltage $V_{data2}$ of the second data signal is different. Therefore, the time when the first transistor T1 is turned on is also different, and the time when the driving transistor DT is turned off is also different, so that the duration of the driving current flowing through the element L to be driven is different. In this way, in a case of a large (i.e., high density) driving current, the element L to be driven may display different gray scales by controlling the duration of the driving current flowing through the element L to be driven, thereby avoiding problems of low luminous efficiency and high power consumption of the element L to be driven when performing displays of low gray scales at a low current density.

In some embodiments, as shown in FIG. 8, in the operating phase (P4 to P5), the voltage $V_{V1}$ of the first voltage signal provided by the first voltage signal terminal V1 gradually decreases with a certain slope. That is, a voltage $V_{V1}$ of the first voltage signal at a start moment (P4) of the operating phase is higher than a voltage $V_{V1}$ of the first voltage signal at an end moment (P5). The voltage of the gate of the first transistor T1 also gradually decreases with a certain slope along with the voltage $V_{V1}$ of the first voltage signal. Referring to FIGS. 11 and 12, when the gate-source voltage difference $V_{gs1}$ of the first transistor T1 is less than $V_{th1}$, the first transistor T1 is turned on. Therefore, the first transistor T1 is in the off state (as shown in FIG. 11) at the start moment (P4) of the operating phase. When the voltage $V_{V1}$ of the first voltage signal changes to be equal to the voltage $V_{data2}$ of the second data signal, the first transistor T1 is just turned on, and when the voltage $V_{V1}$ of the first voltage signal gradually decreases to be less than the voltage $V_{data2}$ of the second data signal, the first transistor T1 is turned on (as shown in FIG. 12). The third voltage signal from the third voltage signal terminal V3 is transmitted to the first node N1 and the gate of the driving transistor DT, so that the driving transistor DT is turned off, and the element L to be driven does not operate.

Figure 13:
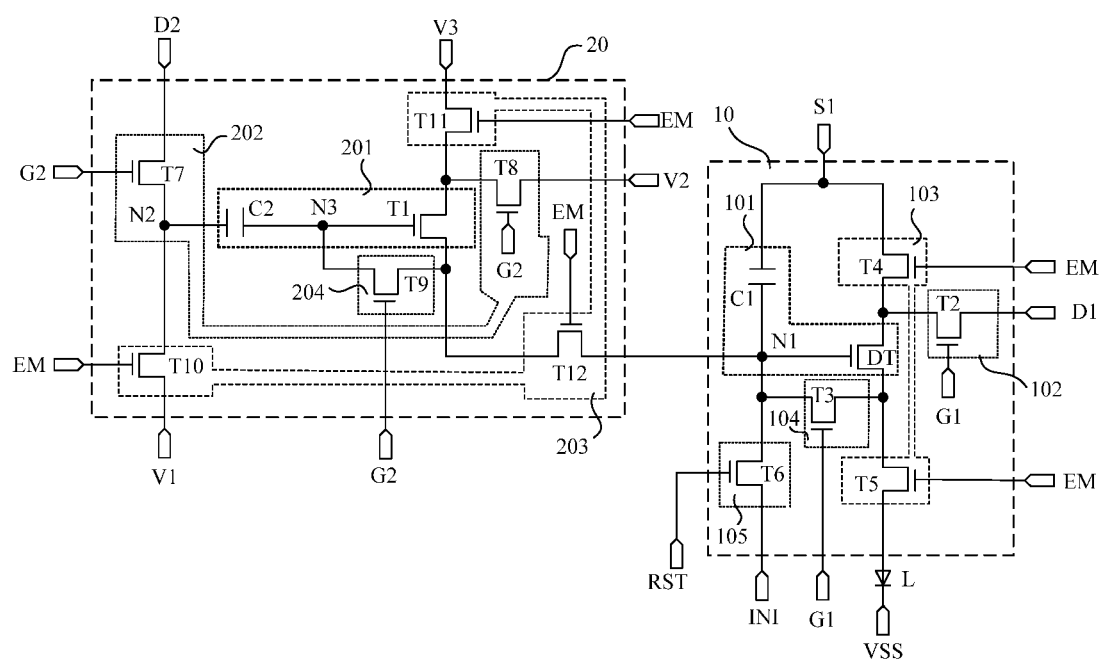
FIG. 13 is a circuit diagram of another pixel driving circuit, in accordance with some embodiments.
Figure 14:
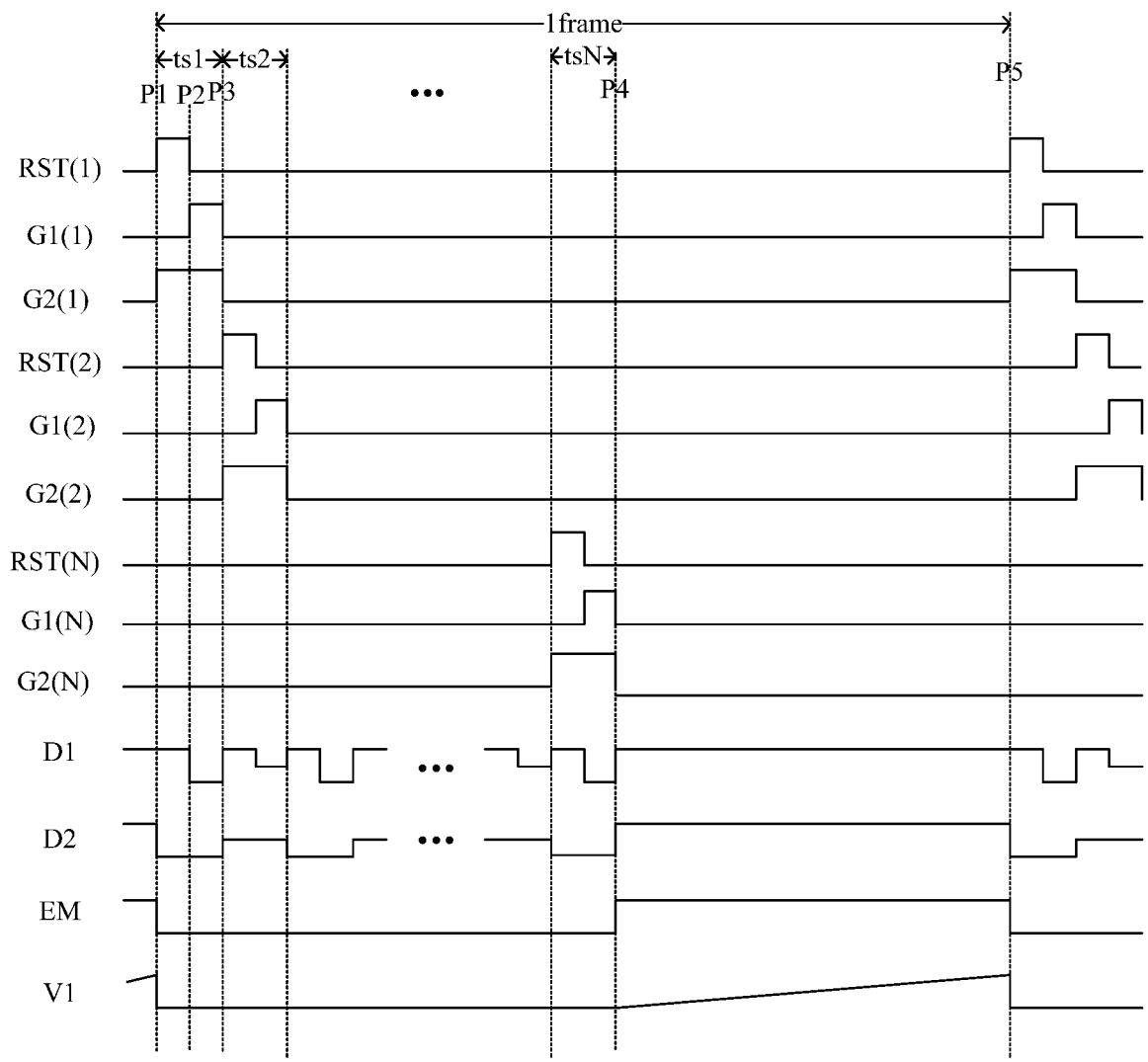
FIG. 14 is another signal timing diagram of a pixel driving circuit, in accordance with some embodiments.

In some other embodiments, as shown in FIG. 14, in the operating phase (P4 to P5), the voltage $V_{V1}$ of the first voltage signal provided by the first voltage signal terminal V1 gradually rises with a certain slope. That is, a voltage $V_{V1}$ of the first voltage signal at the start moment (P4) of the operating phase is lower than a voltage $V_{V1}$ of the first voltage signal at the end moment (P5). The voltage of the gate of the first transistor T1 also gradually rises with a certain slope along with the voltage $V_{V1}$ of the first voltage signal. Referring to FIG. 13, the first transistor T1 is the N-type transistor. When the gate-source voltage difference $V_{gs1}$ of the first transistor T1 is greater than $V_{th1}$, the first transistor T1 is turned on. Therefore, the first transistor T1 is in the off state at the start moment (P4) of the operating phase. When the voltage $V_{V1}$ of the first voltage signal changes to be equal to the voltage $V_{data2}$ of the second data signal, the first transistor T1 is just turned on, and when the voltage $V_{V1}$ of the first voltage signal gradually rises to be greater than the voltage $V_{data2}$ of the second data signal, the first transistor T1 is turned on. The third voltage signal from the third voltage signal terminal V3 is transmitted to the first node N1 and the gate of the driving transistor DT, so that the driving transistor DT is turned off, and the element L to be driven does not operate.

Therefore, under a joint action of the driving control sub-circuit 10 and the time control sub-circuit 20, that is, the amplitude of the driving current flowing through the element L to be driven is controlled by the driving control sub-circuit 10, and the duration of the driving current flowing through the element L to be driven is controlled b the time control sub-circuit 20, displays of different gray scales of the element L to be driven may be achieved. Moreover, in a case where the amplitude of the driving current is maintained in a high value range, the element L to be driven may perform the display of low gray scale by shortening the operating duration of the element L to be driven, so as to improve the luminous efficiency of the element L to be driven, and avoid the problems of low luminous efficiency and high power consumption of the element L to be driven at the low current, thereby improving the display effect of the display panel.

It will be noted that, for the driving processes of the pixel driving circuits in the second row to the N-th row of sub-pixel regions P in the operating phase (P4 to P5), reference may be made to the description of the driving processes of the pixel driving circuits in the first row of sub-pixel regions P in the operating phase (P4 to P5).

In summary, in a frame period, in the scanning phase (P1 to P4), the first data signal and the second data signal are written into each pixel driving circuit; and in the operating phase (P4 to P5), each pixel driving circuit outputs the driving current and controls the duration that the driving current is transmitted to the element L to be driven. In this way, the control of the luminous brightness of the element L to be driven may be achieved. On this basis, by controlling the amplitude of the driving current input to the element L to be driven and the luminous duration, the luminous intensity of the element L to be driven may be changed, and a displayed of gray scale may be achieved. The display of high gray scale may be achieved by increasing the driving current flowing through the element L to be driven and controlling the luminous duration of the element L to be driven to be long luminous duration; and the display of low gray scale may be achieved by shortening the operating duration of the element L to be driven, that is, by shortening the duration of the large driving current flowing through the element L to be driven. In this way, the element L to be driven may operate in a stable current density range, which may avoid a problem of unstable luminescence of the element L to be driven at a low current density, thereby improving the luminous efficiency, and reducing the power consumption of the display panel.

In some embodiments of the present disclosure, a driving method for the pixel driving circuit is provided. As shown in FIGS. 3 and 8, the frame period includes the scanning phase (P1 to P4) and the operating phase (P4 to P5). The scanning phase (P1 to P4) includes the plurality of row scanning phases (ts1~tsN). Each row scanning phase includes S10 to S20, and the operating phase includes S30 to S40.

Referring to FIGS. 4 and 8, the driving method is as follows.

In S10, the driving control sub-circuit 10 writes at least the first data signal from the first data signal terminal D1 into the first driving sub-circuit 101 in response to the first scanning signal received from the first scanning signal terminal G1.

In S20, the time control sub-circuit 20 at least writes the second data signal from the second data signal terminal D2 and the second voltage signal from the second voltage signal terminal V2 into the second driving sub-circuit 201 in response to the second scanning signal received from the second scanning signal terminal G2.

In S30, the driving control sub-circuit 10 makes the first driving sub-circuit 101 output the driving signal according to the first data signal and the first power supply voltage signal from the first power supply voltage signal terminal S1 in response to the enable signal received from the enable signal terminal EM, so as to drive the element L to be driven to operate.

In S40, the time control sub-circuit 20 writes the first voltage signal, from the first voltage signal terminal V1, varying within the set voltage range into the second driving sub-circuit 201, and makes the second driving sub-circuit 201 be electrically connected with the third voltage signal terminal V3 and the first driving sub-circuit 101, in response to the enable signal received from the enable signal terminal EM; and the second driving sub-circuit 201 outputs the third voltage signal from the third voltage signal terminal V3 to the first driving sub-circuit 101 at least in response to the second data signal and the change in voltage of the first voltage signal, so as to make the first driving sub-circuit 101 stop outputting the driving signal to control the operating duration of the element L to be driven.

In some embodiments, as shown in FIGS. 4 and 8, the driving control sub-circuit 10 includes the first driving sub-circuit 101, the first data writing sub-circuit 102, the first threshold voltage compensation sub-circuit 104, and the first control sub-circuit 103. S10 includes S101 to S102, and S30 includes S301.

In S101, the first data writing sub-circuit 102 writes the first data signal from the first data signal terminal D1 into the first electrode of the driving transistor DT in the first driving sub-circuit 101 in response to the first scanning signal received from the first scanning signal terminal G1.

In S102, the first threshold voltage compensation sub-circuit 104 transmits the first data signal and the threshold voltage of the driving transistor DT to the first node N1 in response to the first scanning signal received from the first scanning signal terminal G1, so as to perform the threshold voltage compensation on the driving transistor DT.

In S301, the first control sub-circuit 103 makes the driving transistor DT be electrically connected with the first power supply voltage signal terminal S1 and the element L to be driven in response to the enable signal received from the enable signal terminal EM.

In some embodiments, as shown in FIGS. 4 and 8, the time control sub-circuit 20 includes the second driving sub-circuit 201, the second data writing sub-circuit 202, the second threshold voltage compensation sub-circuit 204, and the second control sub-circuit 203. S20 includes S201 to S202, and S40 includes S401.

In S201, the second data writing sub-circuit 202 writes the second data signal from the second data signal terminal D2 into the second node N2, and writes the second voltage signal from the second voltage signal terminal V2 into the first electrode of the first transistor T1 in the second driving sub-circuit 201, in response to the second scanning signal received from the second scanning signal terminal G2.

In S202, the second threshold voltage compensation sub-circuit 204 transmits the second voltage signal and the threshold voltage of the first transistor T1 in the second driving sub-circuit 201 to the third node N3 in response to the second scanning signal received from the second scanning signal terminal G2.

In S401, the second control sub-circuit 203 transmits the first voltage signal from the first voltage signal terminal V1 to the second node N2, and makes the first transistor T1 be electrically connected with the third voltage signal terminal V3 and the first node N1, in response to the enable signal received from the enable signal terminal EM.

The driving method for the pixel driving circuit has the same beneficial effects as the pixel driving circuits, which will not be repeated herein.

On this basis, in some embodiments, referring to FIG. 1, the display panel further includes a plurality of first scanning signal lines G1(1) to G1(N), a plurality of first data signal lines D1(1) to D1(M), a plurality of second scanning signal lines G2(1) to G2(N), a plurality of second data signal lines D2(1) to D2(M), a plurality of enable signal lines E(1) to E(N), a plurality of first voltage signal lines $L_{V1}$, a plurality of second voltage signal lines $L_{V2}$, a plurality of third voltage signal lines $L_{V3}$ and a plurality of first power supply voltage signal lines $L_{S1}$. The first scanning signal line is configured to provide a first scanning signal to the pixel driving circuit. The second scanning signal line is configured to provide a second scanning signal to the pixel driving circuit. The enable signal line is configured to provide an enable signal to the pixel driving circuit. The first data signal line is configured to provide a first data signal to the pixel driving circuit. The second data signal line is configured to provide a second data signal to the pixel driving circuit. The first voltage signal line is configured to provide a first voltage signal to the pixel driving circuit. The second voltage signal line is configured to provide a second voltage signal to the pixel driving circuit. The third voltage signal line is configured to provide a third voltage signal to the pixel driving circuit. The first power supply voltage signal line $L_{S1}$ is configured to provide a first power supply voltage signal to the pixel driving circuit.

In some examples, pixel driving circuits located in a same row of sub-pixel regions P are connected to a same first scanning signal line among the plurality of first scanning signal lines G1(1) to G1(N), a same second scanning signal line among the plurality of second scanning signal lines G2(1) to G2(N), and a same enable signal line among the plurality of enable signal lines E(1) to E(N). Pixel driving circuits located in a same column of sub-pixel regions P are connected to a same first data signal line among the plurality of first data signal lines D1(1) to D1(M), a same second data signal line among the plurality of second data signal lines D2(1) to D2(M), a same first voltage signal line among the plurality of first voltage signal lines $L_{V1}$, a same second voltage signal line among the plurality of second voltage signal lines $L_{V2}$, a same third voltage signal line among the plurality of third voltage signal lines $L_{V3}$, and a same first power supply voltage signal line among the plurality of first power supply voltage signal lines $L_{S1}$.

For example, as shown in FIG. 1, pixel driving circuits located in the first row of sub-pixel regions P are connected to the first scanning signal line G1(1), the second scanning signal line G2(1), and the enable signal line E(1). Pixel driving circuits located in the second row of sub-pixel regions P are connected to the first scanning signal line G1(2), the second scanning signal line G2(2), and the enable signal line E(2). Pixel driving circuits located in the N-th row of sub-pixel regions P are connected to the first scanning signal line G1(N), the second scanning signal line G2(N), and the enable signal line E(N). Pixel driving circuits located in the first column of sub-pixel regions P are connected to the first data signal line D1 (1), the second data signal line D2 (1), the first voltage signal line $L_{V1}$, the second voltage signal line $L_{V2}$, the third voltage signal line $L_{V3}$ and the first power supply voltage signal line $L_{S1}$. Pixel driving circuits located in the second column of sub-pixel regions P are connected to the first data signal line D1 (2), the second data signal line D2 (2), the first voltage signal line $L_{V1}$, the second voltage signal line $L_{V2}$, the third voltage signal line $L_{V3}$ and the first power supply voltage signal line $L_{S1}$. Pixel driving circuits located in the M-th column of sub-pixel regions P are connected to the first data signal line D1 (M), the second data signal line D2 (M), the first voltage signal line $L_{V1}$, the second voltage signal line $L_{V2}$, the third voltage signal line $L_{V3}$ and the first power supply voltage signal line $L_{S1}$.

The first scanning signal terminal G1 may be understood as an equivalent connection point in a case where the first scanning signal line is connected to the pixel driving circuit. The same is true for the second scanning signal terminal G2. The first data signal terminal D1 may be understood as an equivalent connection point in a case where the first data signal line is connected to the pixel driving circuit. The same is true for the second data signal terminal D2. The enable signal terminal EM may be understood as an equivalent connection point in a case where the enable signal line is connected to the pixel driving circuit. The first voltage signal terminal V1 may be understood as an equivalent connection point in a case where the first voltage signal line $L_{V1}$ is connected to the pixel driving circuit. The second voltage signal terminal V2 may be understood as an equivalent connection point in a case where the second voltage signal line $L_{V2}$ is connected to the pixel driving circuit. The third voltage signal terminal V3 may be understood as an equivalent connection point in a case where the third voltage signal line $L_{V3}$ is connected to the pixel driving circuit. The first power supply voltage signal terminal may be understood as an equivalent connection point in a case where the first power supply voltage signal line $L_{S1}$ is connected to the pixel driving circuit.

It will be noted that, those skilled in the art may set the connection manners in which the pixel driving circuits in the sub-pixel regions P are connected with the first voltage signal line $L_{V1}$, the second voltage signal line $L_{V2}$, the third voltage signal line $L_{V3}$, and the first power supply voltage signal line $L_{S1}$ according to a spatial structure of the display panel. FIG. 1 illustrates an example in which the pixel driving circuits located in any two columns of sub-pixel regions P are connected to different first voltage signal lines $L_{V1}$, different second voltage signal lines $L_{V2}$, different third voltage signal lines $L_{V3}$, and different first power supply voltage signal lines $L_{S1}$. However, the embodiments of the present disclosure are not limited thereto. It may be possible that the pixel driving circuits located in a plurality of columns of sub-pixel regions P (e.g., two or three or four columns) are connected to a same first voltage signal line $L_{V1}$, a same second voltage signal line $L_{V2}$, a same third voltage signal line $L_{V3}$, and a same first power supply voltage signal line $L_{S1}$.

In some embodiments, the display panel further includes a plurality of second power supply voltage signal lines (not shown in FIG. 1). In some examples, elements L to be driven located in a same column of sub-pixel regions P are connected to a same second power supply voltage signal line among the plurality of second power supply voltage signal lines.

Here, the second power supply voltage signal terminal VSS may be understood as an equivalent connection point in a case where the second power supply voltage signal line is connected to the element L to be driven.

In some embodiments, as shown in FIG. 1, the display panel further includes a plurality of reset signal lines R(1) to R(N) and a plurality of initial signal lines (not shown in FIG. 1). The reset signal line is configured to provide the reset signal to the pixel driving circuit. The initial signal line is configured to provide the initial signal to the pixel driving circuit.

In some examples, pixel driving circuits located in a same row of sub-pixel regions P are connected to a same reset signal line among the plurality of reset signal lines R(1) to R(N), and pixel driving circuits located in a same column of sub-pixel regions P are connected to a same initial signal line among the plurality of initial signal lines.

For example, as shown in FIG. 1, the pixel driving circuits located in the first row of sub-pixel regions P are connected to the reset signal line R(1). The pixel driving circuits located in the second row of sub-pixel regions P are connected to the reset signal line R(2). The pixel driving circuits located in the N-th row of sub-pixel regions P are connected to the reset signal line R(N).

The reset signal terminal RST may be understood as an equivalent connection point in a case where the reset signal line is connected to the pixel driving circuit. The initial signal terminal INI may be understood as an equivalent connection point in a case where the initial signal line is connected to the pixel driving circuit.

It will be noted that, arrangements of the plurality of signal lines included in the display panel described in the embodiments and the wiring diagram of the display panel shown in FIG. 1 are only some examples, and the embodiments of the present disclosure are not limited thereto.

The foregoing descriptions are merely specific implementation manners of the present disclosure, but the protection scope of the present disclosure is not limited thereto. And changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A pixel driving circuit, comprising:
a driving control sub-circuit connected at least to a first scanning signal terminal, a first data signal terminal, a first power supply voltage signal terminal, an enable signal terminal, and a first electrode of an element to be driven, the driving control sub-circuit including a first driving sub-circuit, wherein the driving control sub-circuit is configured to: write at least a first data signal from the first data signal terminal into the first driving sub-circuit in response to a first scanning signal received from the first scanning signal terminal; and make the first driving sub-circuit output a driving signal according to the first data signal and a first power supply voltage signal from the first power supply voltage signal terminal in response to an enable signal received from the enable signal terminal, so as to drive the element to be driven to operate; and
a time control sub-circuit connected at least to a first voltage signal terminal, a second voltage signal terminal, a third voltage signal terminal, a second scanning signal terminal, a second data signal terminal, the enable signal terminal, and the first driving sub-circuit, the time control sub-circuit including a second driving sub-circuit, wherein the time control sub-circuit being configured to: write a second data signal from the second data signal terminal and a second voltage signal from the second voltage signal terminal into the second driving sub-circuit in response to a second scanning signal received from the second scanning signal terminal; and write a first voltage signal varying within a set voltage range from the first voltage signal terminal into the second driving sub-circuit, and make the second driving sub-circuit be electrically connected with the third voltage signal terminal and the first driving sub-circuit, in response to the enable signal received from the enable signal terminal; and the second driving sub-circuit is configured to output a third voltage signal from the third voltage signal terminal to the first driving sub-circuit at least in response to the second data signal and a change in voltage of the first voltage signal, so as to make the first driving sub-circuit stop outputting the driving signal, and control operating duration of the element to be driven, wherein
the driving control sub-circuit further includes a first data writing sub-circuit, a first threshold voltage compensation sub-circuit, and a first control sub-circuit;

the first driving sub-circuit includes a driving transistor and a first capacitor, a first electrode of the first capacitor is directly connected to the first power supply voltage signal terminal, and a second electrode of the first capacitor is connected to a first node; and a gate of the driving transistor is connected to the first node;

the first data writing sub-circuit is connected to the first scanning signal terminal, the first data signal terminal, and a first electrode of the driving transistor; and the first data writing sub-circuit is configured to write the first data signal from the first data signal terminal into the first electrode of the driving transistor in response to the first scanning signal received from the first scanning signal terminal;

the first threshold voltage compensation sub-circuit is connected to the first scanning signal terminal, a second electrode of the driving transistor, and the first node; and the first threshold voltage compensation sub-circuit is configured to transmit the first data signal and a threshold voltage of the driving transistor to the first node in response to the first scanning signal received from the first scanning signal terminal, so as to perform a threshold voltage compensation on the driving transistor; and the first control sub-circuit is connected to the enable signal terminal, the first power supply voltage signal terminal, the driving transistor, and the first electrode of the element to be driven; and the first control sub-circuit is configured to make the first power supply voltage signal terminal be electrically connected with the first electrode of the driving transistor, and make the second electrode of the driving transistor be electrically connected with the first electrode of the element to be driven, in response to the enable signal received from the enable signal terminal, wherein the first control sub-circuit includes a fourth transistor and a fifth transistor;

a gate of the fourth transistor is connected to the enable signal terminal, a first electrode of the fourth transistor is connected to the first power supply voltage signal terminal, and a second electrode of the fourth transistor is connected to the first electrode of the driving transistor; and a gate of the fifth transistor is connected to the enable signal terminal, a first electrode of the fifth transistor is connected to the second electrode of the driving transistor, and a second electrode of the fifth transistor is connected to the first electrode of the element to be driven.

2. The pixel driving circuit according to claim 1, wherein the first data writing sub-circuit includes a second transistor; and a gate of the second transistor is connected to the first scanning signal terminal, a first electrode of the second transistor is connected to the first data signal terminal, and a second electrode of the second transistor is connected to the first electrode of the driving transistor.

3. The pixel driving circuit according to claim 1, wherein the first threshold voltage compensation sub-circuit includes a third transistor; and a gate of the third transistor is connected to the first scanning signal terminal, a first electrode of the third transistor is connected to the second electrode of the driving transistor, and a second electrode of the third transistor is connected to the first node.

4. The pixel driving circuit according to claim 1, wherein the driving control sub-circuit further includes a reset sub-circuit; and the reset sub-circuit is connected to an initial signal terminal, a reset signal terminal and the first node; and the reset sub-circuit is configured to transmit an initial signal from the initial signal terminal to the first node in response to a reset signal received from the reset signal terminal, so as to reset the first node.

5. The pixel driving circuit according to claim 4, wherein the reset sub-circuit includes a sixth transistor; and a gate of the sixth transistor is connected to the reset signal terminal, a first electrode of the sixth transistor is connected to the initial signal terminal, and a second electrode of the sixth transistor is connected to the first node.

6. The pixel driving circuit according to claim 1, wherein the time control sub-circuit further includes a second data writing sub-circuit, a second threshold voltage compensation sub-circuit, and a second control sub-circuit;

the second driving sub-circuit includes a first transistor and a second capacitor, a first electrode of the second capacitor is connected to a second node, and a second electrode of the second capacitor is connected to a third node; and a gate of the first transistor is connected to the third node;

the second data writing sub-circuit is connected to the second scanning signal terminal, the second voltage signal terminal, the second data signal terminal, the second node, and a first electrode of the first transistor; and the second data writing sub-circuit is configured to write the second data signal from the second data signal terminal into the second node, and write the second voltage signal from the second voltage signal terminal into the first electrode of the first transistor, in response to the second scanning signal received from the second scanning signal terminal;

the second threshold voltage compensation sub-circuit is connected to the second scanning signal terminal, a second electrode of the first transistor, and the third node; and the second threshold voltage compensation sub-circuit is configured to transmit the second voltage signal and a threshold voltage of the first transistor to the third node, in response to the second scanning signal received from the second scanning signal terminal; and the second control sub-circuit is connected to the enable signal terminal, the first voltage signal terminal, the third voltage signal terminal, the first node, the second node, and the first transistor; and the second control sub-circuit is configured to transmit the first voltage signal from the first voltage signal terminal to the second node, and make the first transistor be electrically connected with the third voltage signal terminal and the first node, in response to the enable signal received from the enable signal terminal.

7. The pixel driving circuit according to claim 6, wherein the second data writing sub-circuit includes a seventh transistor and an eighth transistor;

a gate of the seventh transistor is connected to the second scanning signal terminal, a first electrode of the seventh transistor is connected to the second data signal terminal, and a second electrode of the seventh transistor is connected to the second node; and a gate of the eighth transistor is connected to the second scanning signal terminal, a first electrode of the eighth transistor is connected to the second voltage signal terminal, and a second electrode of the eighth transistor is connected to the first electrode of the first transistor.

8. The pixel driving circuit according to claim 6, wherein the second threshold voltage compensation sub-circuit includes a ninth transistor; and
a gate of the ninth transistor is connected to the second scanning signal terminal, a first electrode of the ninth transistor is connected to the second electrode of the first transistor, and a second electrode of the ninth transistor is connected to the third node.

9. The pixel driving circuit according to claim 6, wherein the second control sub-circuit includes a tenth transistor, an eleventh transistor, and a twelfth transistor;
a gate of the tenth transistor is connected to the enable signal terminal, a first electrode of the tenth transistor is connected to the first voltage signal terminal, and a second electrode of the tenth transistor is connected to the second node;
a gate of the eleventh transistor is connected to the enable signal terminal, a first electrode of the eleventh transistor is connected to the third voltage signal terminal, and a second electrode of the eleventh transistor is connected to the first electrode of the first transistor; and
a gate of the twelfth transistor is connected to the enable signal terminal, a first electrode of the twelfth transistor is connected to the second electrode of the first transistor, and a second electrode of the twelfth transistor is connected to the first node.

10. A display panel, comprising:
a base;
a plurality of pixel driving circuits disposed on the base, each of the plurality of pixel driving circuits being the pixel driving circuit according to claim 1; and
a plurality of elements to be driven disposed on the base, and an element to be driven of the plurality of elements to be driven being connected to a corresponding pixel driving circuit.

11. The display panel according to claim 10, wherein the display panel has a plurality of sub-pixel regions, and each pixel driving circuit is disposed in one sub-pixel region;
the display panel further comprises:
a plurality of first scanning signal lines, and first scanning signal terminals connected to pixel driving circuits located in a same row of sub-pixel regions being connected to a corresponding first scanning signal line;
a plurality of first data signal lines, and first data signal terminals connected to pixel driving circuits located in a same column of sub-pixel regions being connected to a corresponding first data signal line;
a plurality of second scanning signal lines, and second scanning signal terminals connected to pixel driving circuits located in a same row of sub-pixel regions being connected to a corresponding second scanning signal line; and
a plurality of second data signal lines, and second data signal terminals connected to pixel driving circuits located in a same column of sub-pixel regions being connected to a corresponding second data signal line.

12. The display panel according to claim 10, wherein the element to be driven is a current mode light-emitting diode.

13. The display panel according to claim 12, wherein the current mode light-emitting diode is a mini light-emitting diode (Mini-LED) or a micro light-emitting diode (Micro-LED).

14. The display panel according to claim 10, wherein the base is a glass substrate.

15. A driving method for the pixel driving circuit according to claim 1, comprising:
writing, by the driving control sub-circuit, at least the first data signal from the first data signal terminal into the first driving sub-circuit, in response to the first scanning signal received from the first scanning signal terminal;
writing, by the time control sub-circuit, at least the second data signal from the second data signal terminal and the second voltage signal from the second voltage signal terminal into the second driving sub-circuit, in response to the second scanning signal received from the second scanning signal terminal;
making, by the driving control sub-circuit, the first driving sub-circuit output the driving signal according to the first data signal and the first power supply voltage signal from the first power supply voltage signal terminal, in response to the enable signal received from the enable signal terminal, so as to drive the element to be driven to operate; and
writing, by the time control sub-circuit, the first voltage signal varying within the set voltage range from the first voltage signal terminal into the second driving sub-circuit, and making, by the time control sub-circuit, the second driving sub-circuit be electrically connected with the third voltage signal terminal and the first driving sub-circuit, in response to the enable signal received from the enable signal terminal; wherein the second driving sub-circuit outputs the third voltage signal from the third voltage signal terminal to the first driving sub-circuit to make the first driving sub-circuit stop outputting the driving signal, at least in response to the second data signal and the change in voltage of the first voltage signal, so as to control the operating duration of the element to be driven, wherein
the driving control sub-circuit further includes a first data writing sub-circuit, a first threshold voltage compensation sub-circuit and a first control sub-circuit; the first driving sub-circuit includes a driving transistor and a first capacitor; a first electrode of the first capacitor is directly connected to the first power supply voltage signal terminal, and a second electrode of the first capacitor is connected to a first node; a gate of the driving transistor is connected to the first node; the first control sub-circuit includes a fourth transistor and a fifth transistor; a gate of the fourth transistor is connected to the enable signal terminal, a first electrode of the fourth transistor is connected to the first power supply voltage signal terminal, and a second electrode of the fourth transistor is connected to the first electrode of the driving transistor; and a gate of the fifth transistor is connected to the enable signal terminal, a first electrode of the fifth transistor is connected to the second electrode of the driving transistor, and a second electrode of the fifth transistor is connected to the first electrode of the element to be driven;
writing, by the driving control sub-circuit, at least the first data signal from the first data signal terminal into the first driving sub-circuit, in response to the first scanning signal received from the first scanning signal terminal, includes:
writing, by the first data writing sub-circuit, the first data signal into a first electrode of the driving transistor, in response to the received first scanning signal;
transmitting, by the first threshold voltage compensation sub-circuit, the first data signal and a threshold voltage of the driving transistor to the first node, in response to the received first scanning signal, so as to perform a threshold voltage compensation on the driving transistor; and making, by the driving control sub-circuit, the first driving sub-circuit output the driving signal according to the first data signal and the first power supply voltage signal from the first power supply voltage signal terminal, in response to the enable signal received from the enable signal terminal, includes:

making, by the first control sub-circuit, the driving transistor be electrically connected with the first power supply voltage signal terminal and the element to be driven, in response to the received enable signal, wherein the fourth transistor and the fifth transistor are turned on in response to the enable signal received from the enable signal terminal; the first power supply voltage signal from the first power supply voltage signal terminal is transmitted to the first electrode of the driving transistor through the fourth transistor; and the driving signal output from the second electrode of the driving transistor is transmitted to the element to be driven through the fifth transistor, so as to drive the element to be driven to emit light.

16. The driving method for the pixel driving circuit according to claim 15, wherein the time control sub-circuit further includes a second data writing sub-circuit, a second threshold voltage compensation sub-circuit, and a second control sub-circuit; the second driving sub-circuit includes a first transistor and a second capacitor, a first electrode of the second capacitor is connected to a second node, a second electrode of the second capacitor is connected to a third node; and a gate of the first transistor is connected to the third node; and writing, by the time control sub-circuit, at least the second data signal from the second data signal terminal and the second voltage signal from the second voltage signal terminal into the second driving sub-circuit, in response to the second scanning signal received from the second scanning signal terminal, includes:

writing, by the second data writing sub-circuit, the second data signal into the second node, and writing, by the second data writing sub-circuit, the second voltage signal into a first electrode of the first transistor, in response to the received second scanning signal;

transmitting, by the second threshold voltage compensation sub-circuit, the second voltage signal and a threshold voltage of the first transistor to the third node, in response to the received second scanning signal; and writing, by the time control sub-circuit, the first voltage signal varying within the set voltage range from the first voltage signal terminal into the second driving sub-circuit, and making, by the time control sub-circuit, the second driving sub-circuit be electrically connected with the third voltage signal terminal and the first node, in response to the enable signal received from the enable signal terminal; wherein the second driving sub-circuit outputs the third voltage signal from the third voltage signal terminal to the first node to make the first driving sub-circuit stop outputting the driving signal, at least in response to the second data signal and the change in voltage of the first voltage signal, includes:

transmitting, by the second control sub-circuit, the first voltage signal to the second node, and making, by the second control sub-circuit, the first transistor be electrically connected with the third voltage signal terminal and the first node, in response to the received enable signal.

* * * * *